United States Patent
Kim et al.

(10) Patent No.: US 10,985,451 B2
(45) Date of Patent: Apr. 20, 2021

(54) ANTENNA MODULE

(71) Applicant: SAMSUNG ELECTRONICS CO., LTD., Suwon-si (KR)

(72) Inventors: Doo Il Kim, Suwon-Si (KR); Dae Kwon Jung, Suwon-Si (KR); Young Sik Hur, Suwon-Si (KR); Won Wook So, Suwon-Si (KR); Yong Ho Baek, Suwon-Si (KR); Woo Jung Choi, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 279 days.

(21) Appl. No.: 16/112,432

(22) Filed: Aug. 24, 2018

(65) Prior Publication Data
US 2019/0280374 A1 Sep. 12, 2019

(30) Foreign Application Priority Data
Mar. 12, 2018 (KR) ........................ 10-2018-0028802

(51) Int. Cl.
*H01Q 1/22* (2006.01)
*H01Q 1/38* (2006.01)
(Continued)

(52) U.S. Cl.
CPC ........... *H01Q 1/38* (2013.01); *H01L 21/4853* (2013.01); *H01L 21/4857* (2013.01);
(Continued)

(58) Field of Classification Search
CPC ... H01Q 1/2283; H01L 23/5383; H01L 23/66; H01L 2223/6661–6677
See application file for complete search history.

(56) References Cited

U.S. PATENT DOCUMENTS 7,126,541 B2   10/2006   Mohamadi
7,236,070 B2    6/2007   Ajioka et al.
(Continued)

FOREIGN PATENT DOCUMENTS

CN   1568546 A   1/2005
CN   1595649 A   3/2005
(Continued)

OTHER PUBLICATIONS

Communication dated Dec. 27, 2019 issued by the Taiwan Intellectual Property Office in counterpart Taiwan Application No. 107129188.
(Continued)

*Primary Examiner* — Hasan Z Islam
(74) *Attorney, Agent, or Firm* — Sughrue Mion, PLLC

(57) ABSTRACT

An antenna module includes a first connection member including at least one first wiring layer and at least one first insulating layer; an antenna package disposed on a first surface of the first connection member, and including a plurality of antenna members and a plurality of feed vias; an integrated circuit (IC) disposed on a second surface of the first connection member and electrically connected to the corresponding wire of at least one first wiring layer; and a second connection member including at least one second wiring layer electrically connected to the IC and at least one second insulating layer, and disposed between the first connection member and the IC, wherein the second connection member has a third surface facing the first connection member and having an area smaller than that of the second surface, and a fourth surface facing the IC.

13 Claims, 23 Drawing Sheets

(51) Int. Cl.

| | |
|---|---|
| *H01L 23/31* | (2006.01) |
| *H01L 23/538* | (2006.01) |
| *H01L 23/552* | (2006.01) |
| *H01L 23/66* | (2006.01) |
| *H01L 21/48* | (2006.01) |
| *H01L 21/56* | (2006.01) |
| *H01L 23/00* | (2006.01) |
| *H05K 1/11* | (2006.01) |
| *H01Q 9/16* | (2006.01) |

(52) U.S. Cl.
CPC ......... *H01L 21/565* (2013.01); *H01L 21/568* (2013.01); *H01L 23/3121* (2013.01); *H01L 23/5383* (2013.01); *H01L 23/5386* (2013.01); *H01L 23/5389* (2013.01); *H01L 23/552* (2013.01); *H01L 23/66* (2013.01); *H01L 24/19* (2013.01); *H01L 24/20* (2013.01); *H05K 1/115* (2013.01); *H01L 2223/6677* (2013.01); *H01L 2224/214* (2013.01); *H01L 2924/19105* (2013.01); *H01L 2924/3025* (2013.01); *H01Q 9/16* (2013.01); *H05K 2201/10015* (2013.01); *H05K 2201/10098* (2013.01); *H05K 2201/10522* (2013.01); *H05K 2201/10545* (2013.01)

(56) References Cited

U.S. PATENT DOCUMENTS

| | | | |
|---|---|---|---|
| 7,547,967 | B2 | 6/2009 | Jobetto et al. |
| 8,384,596 | B2 | 2/2013 | Rofougaran et al. |
| 8,586,450 | B2 | 11/2013 | Saugier |
| 9,196,951 | B2 | 11/2015 | Baks et al. |
| 9,431,369 | B2* | 8/2016 | Chih ................ H01Q 1/2283 |
| 10,170,838 | B2* | 1/2019 | Garcia ............ G06K 19/07749 |
| 10,553,520 | B2 | 2/2020 | Iizuka et al. |
| 2005/0037535 | A1 | 2/2005 | Ogawa |
| 2014/0140031 | A1* | 5/2014 | Fujita ................ H05K 1/144 361/803 |
| 2018/0062263 | A1* | 3/2018 | Ueda ................ H01Q 21/29 |
| 2018/0205155 | A1* | 7/2018 | Mizunuma ........ H01Q 21/0025 |
| 2019/0173167 | A1* | 6/2019 | Ariumi ............. H01Q 21/065 |
| 2019/0198973 | A1* | 6/2019 | Chen ............... H01L 23/53257 |

FOREIGN PATENT DOCUMENTS

| | | |
|---|---|---|
| CN | 102254858 A | 11/2011 |
| CN | 107431054 A | 12/2017 |
| JP | 2004-128029 A | 4/2004 |
| JP | 2009-038696 A | 2/2009 |
| KR | 10-2005-0065861 A | 6/2005 |
| KR | 10-0986230 B1 | 10/2010 |

OTHER PUBLICATIONS

Office Action issued in Korean Patent Application No. 10-2018-0028802 dated Dec. 24, 2018, with English translation.

Communication dated Apr. 20, 2020 issued by the State Intellectual Property Office of the People's Republic of China in counterpart Application No. 201910185106.6.

* cited by examiner

ANTENNA MODULE

CROSS-REFERENCE TO RELATED APPLICATION(S)

This application claims the benefit of priority to Korean Patent Application No. 10-2018-0028802 filed on Mar. 12, 2018, in the Korean Intellectual Property Office, the disclosure of which is incorporated herein by reference in its entirety.

TECHNICAL FIELD

The present disclosure relates to an antenna module.

BACKGROUND

Mobile communications data traffic is rapidly increasing every year. Technological developments are being actively conducted to support such rapidly increasing data in real time in a wireless network. For example, applications such as contents of IoT (Internet of Thing) based data, augmented reality (AR), virtual reality (VR), live VR/AR combined with SNS, autonomous drive, sync view (a real time image of a user point of view is transmitted using a ultra small camera), and the like need communications (e.g., 5G communications, mmWave communications, etc.) for supporting a transmission and a reception of a large amount of data.

Therefore, recently, millimeter wave (mmWave) communications including 5th (5G) communications have been actively researched, and research into commercialization/standardization of an antenna module smoothly implementing millimeter band wave communications are also actively performed.

Since radio frequency (RF) signals of high frequency bands (e.g., 24 GHz, 28 GHz, 36 GHz, 39 GHz, 60 GHz, and the like) are easily absorbed in a transmission process and lead to loss, quality of communications may be sharply deteriorated. Therefore, an antenna for communications of the high frequency bands requires a technical approach different from a conventional antenna technology, and may require special technology developments such as a separate power amplifier for securing an antenna gain, integrating an antenna and RFIC, securing effective isotropic radiated power (EIRP), and the like.

Conventionally, the antenna module providing a millimeter wave communications environment uses a structure in which an integrated circuit (IC) and an antenna are disposed on a board and are connected to each other by a coaxial cable in order to satisfy a high level of antennal performance (e.g., a transmission and reception rate, a gain, directivity, and the like) according to a high frequency. However, such a structure may cause a shortage of an antenna layout space, a restriction of the degree of freedom of an antenna shape, an increase in interference between the antenna and the IC, and an increase in the size/cost of the antenna module.

SUMMARY

An aspect of the present disclosure may provide an antenna module capable of being miniaturized while securing a high level of antenna performance by having a structure in which an antenna, an integrated circuit (IC), and a second connection member are efficiently integrated with one another.

According to an aspect of the present disclosure, an antenna module may include a first connection member including at least one first wiring layer and at least one first insulating layer; an antenna package disposed on a first surface of the first connection member, and including a plurality of antenna members configured to transmit and/or receive a radio frequency (RF) signal and a plurality of feed vias in which one end of each thereof is electrically connected to each of the plurality of antenna members and the other end of each thereof is electrically connected to a corresponding wire of at least one first wiring layer; an integrated circuit (IC) disposed on a second surface of the first connection member and electrically connected to the corresponding wire of at least one first wiring layer; and a second connection member including at least one second wiring layer electrically connected to the IC and at least one second insulating layer, and disposed between the first connection member and the IC, wherein the second connection member has a third surface facing the first connection member and having an area smaller than that of the second surface, and a fourth surface facing the IC.

According to another aspect of the present disclosure, an antenna module may include a first connection member including at least one first wiring layer and at least one first insulating layer; an antenna package disposed on a first surface of the first connection member, and including a plurality of antenna members configured to transmit and/or receive a radio frequency (RF) signal and a plurality of feed vias in which one end of each thereof is electrically connected to each of the plurality of antenna members and the other end of each thereof is electrically connected to a corresponding wire of at least one first wiring layer; a support member disposed on a second surface of the first connection member and electrically connected to the corresponding wire of at least one first wiring layer so that an intermediate frequency (IF) signal or a base band signal passes therethrough; an integrated circuit (IC) disposed on the second surface of the first connection member and electrically connected to the corresponding wire of at least one first wiring layer to transmit the IF signal or the base band signal by receiving the RF signal or to transmit the RF signal by receiving the IF signal or the base band signal; and a second connection member including at least one second wiring layer electrically connected to the IC and at least one second insulating layer, disposed between the first connection member and the IC, and surrounded by the support member.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
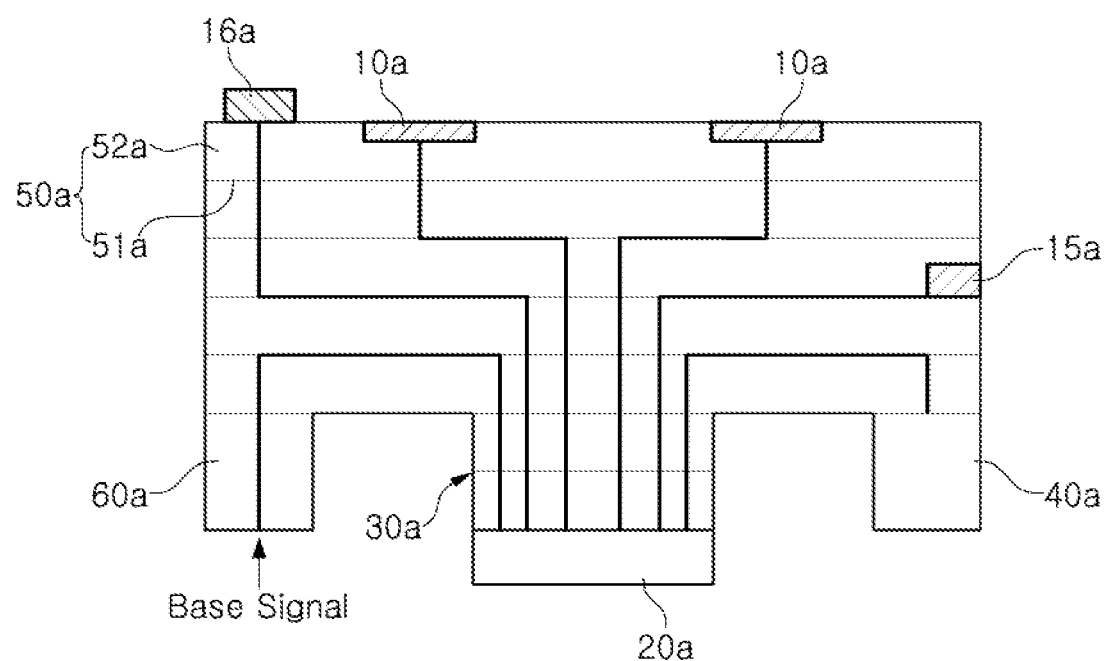
FIG. 1 is a view illustrating an antenna module according to an exemplary embodiment in the present disclosure.

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the above-mentioned upward and downward directions, and a horizontal direction refers to a direction perpendicular to the above-mentioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

FIG. 1 is a view illustrating an antenna module according to an exemplary embodiment in the present disclosure.

Referring to FIG. 1, an antenna module according to an exemplary embodiment in the present disclosure may have a structure in which an antenna 10a, an integrated circuit (IC) 20a, and a second connection member 30a are integrated with one another, and may include the antenna 10a, a second directional antenna 15a, a chip antenna 16a, the IC 20a, a passive component m 40a, a substrate 50a, and a sub-substrate 60a.

The substrate 50a may include at least one wiring layer 51a and at least one insulating layer 52a and may include at least one via penetrating through the insulating layer to electrically connect a plurality of wiring layers to each other. For example, the substrate 50a may be implemented as a printed circuit board and may have a structure in which an antenna package of an upper end and a connection member of a lower end are coupled to each other. For example, the antenna package may be designed in view of transmission and reception efficiency of a radio frequency (RF) signal, and the connection member may be designed in view of wiring efficiency.

The antenna 10a may receive or transmit the RF signal, and may transmit the received RF signal to the IC 20a or receive an RF signal for transmission from the IC 20*a*. The antenna 10*a* may include a plurality of antenna members, thereby further improving antenna performance.

The antenna 10*a* may be disposed on an upper end of the substrate 50 to transmit and receive the RF signal, and may be implemented by the plurality of antenna members. For example, the antenna 10*a* may have a structure of a patch antenna and may be disposed to be adjacent to an upper surface of the substrate 50*a*.

The second directional antenna 15*a* may be disposed to be adjacent to a side surface of the substrate 50*a* to transmit and receive the RF signal in a side surface direction. For example, the second directional antenna 15*a* may have a structure of a dipole antenna or a microstrip antenna.

The chip antenna 16*a* may have a three-dimensional structure including a dielectric having a high dielectric constant and a plurality of electrodes disposed on opposite surfaces of the dielectric, and may be disposed to be adjacent to the upper surface and the side surface of the substrate 50*a* to transmit and receive the RF signal in a side surface direction and/or an upper surface direction.

The antenna module according to an exemplary embodiment in the present disclosure may include at least two of the antenna 10*a*, the second directional antenna 15*a*, and the chip antenna 16*a*, thereby omni-directionally forming a radiation pattern.

The IC 20*a* may convert the received RF signal into an intermediate frequency (IF) signal or a base band signal, and may transmit the converted IF signal or based band signal to an IF IC, a base band IC, or a communication modem disposed outside of the antenna module. In addition, the IC 20*a* may convert the IF signal or the base band signal received from the IF IC, the base band IC, or the communication modem disposed outside of the antenna module into an RF signal, and transmit the converted RF signal to the antenna 10*a*. Here, frequencies (e.g., 24 GHz, 28 GHz, 36 GHz, 39 GHz, and 60 GHz) of the RF signal may be greater than those (e.g., 2 GHz, 5 GHz, 10 GHz, and the like) of the IF signal. Meanwhile, the IC 20*a* may perform at least some of a frequency conversion, amplification, filtering, a phase control, and a power generation to generate a converted signal.

The IC 20*a* and the passive component 40*a* may be disposed to be adjacent to a lower surface of the substrate 50*a*. The passive component 40*a* may include a capacitor (e.g., a multilayer ceramic capacitor (MLCC)), an inductor, or a chip resistor to provide required impedance to the IC 20*a*.

The sub-substrate 60*a* may be disposed on the lower surface of the substrate 50*a*, and may provide a path of the IF signal or the base band signal. The sub-substrate 60*a* may be implemented as a support member seated on an outer surface of the antenna module to support the antenna module.

The IC 20*a* may require a plurality of ground patterns to improve performance in the process of generating the converted signal, and may require additional electrical paths between the respective components within the IC 20*a*.

Although the substrate 50*a* may provide the plurality of ground patterns and the additional electrical paths, it may cause an increase of a size (e.g., an area and a height of a layer) due to securing of a space corresponding to the plurality of ground patterns and the additional electrical paths. In addition, the substrate 50*a* may not have more than a predetermined number of layers depending on structural characteristics thereof. Furthermore, the substrate 50*a* may require an additional space for antenna performance or wiring efficiency.

Therefore, the antenna module according to an exemplary embodiment in the present disclosure may include a second connection member 30*a* disposed between the substrate 50*a* and the IC 20*a*. For example, the second connection member 30*a* may provide the ground pattern and the additional electrical paths required by the IC 20*a*. Accordingly, the substrate 50*a* may be miniaturized without separately sacrificing antenna performance or wiring efficiency.

In addition, an area of an upper surface of the second connection member 30*a* may be smaller than that of the lower surface of the substrate 50*a*. Accordingly, the second connection member 30*a* may be more easily coupled to the substrate 50*a*. For example, the second connection member 30*a* may be formed sequentially from the upper surface of the IC 20*a* in units of layers and may be then bonded to the substrate 50*a*.

Figure 2:
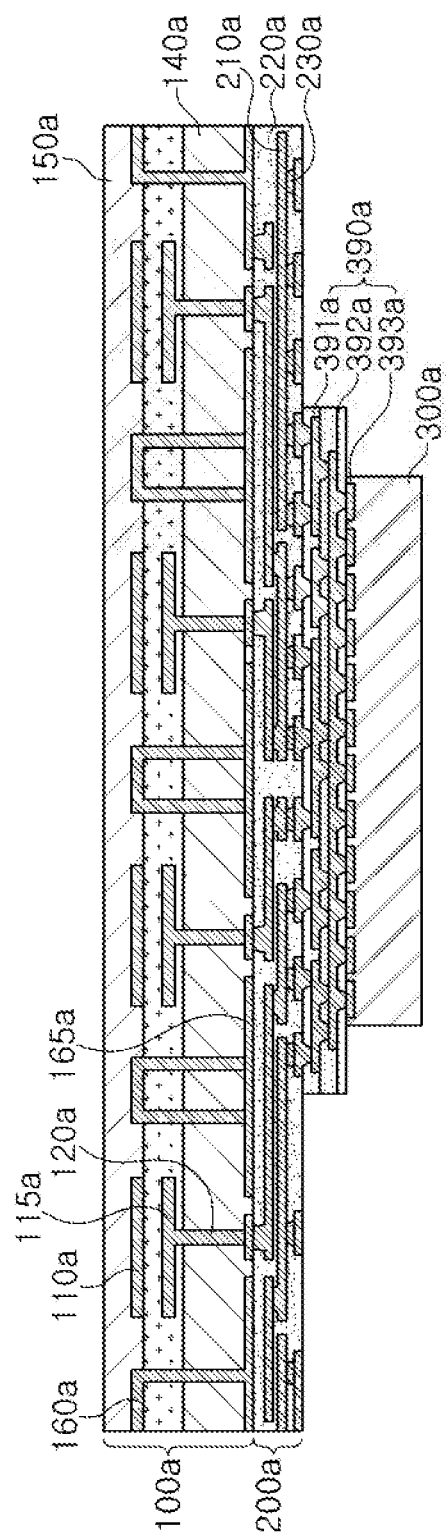
FIG. 2 is a view illustrating an antenna module according to an exemplary embodiment in the present disclosure in more detail.

FIG. 2 is a view illustrating an antenna module according to an exemplary embodiment in the present disclosure in more detail.

Referring to FIG. 2, the antenna module according to an exemplary embodiment in the present disclosure may include a substrate having a structure in which an antenna package 100*a* and a connection member 200*a* are coupled to each other.

The antenna package 100*a* may include a plurality of antenna members 115*a* configured to transmit or receive an RF signal, and a plurality of feed vias 120*a*. One end of each of the feed vias 120*a* is electrically connected to one of the plurality of antenna members 115*a* and the other end of each of the feed vias 120*a* is electrically connected to a corresponding wire of at least one wiring layer 210*a* of the connection member 200*a*. The antenna package 100*a* may further include a dielectric layer 140*a* having a thickness greater than that of at least one insulating layer 220*a* of the connection layer 200*a*, and may be disposed on an upper end of the connection member 200*a*. Accordingly, the antenna module according to an exemplary embodiment in the present disclosure may form a radiation pattern in an upper surface direction to transmit and receive the RF signal.

Due to a length of the feed via 120*a* and the thickness of the dielectric layer 140*a*, a boundary condition for transmission and reception operation of the RF signal of the plurality of antenna members 115*a* may be freely designed, and an unnecessary boundary condition (e.g., an interlayer interval, an interlayer implant, or the like) may be removed. Accordingly, since the feed vias 120*a* and the dielectric layer 140*a* may provide the boundary conditions (e.g., a small manufacturing tolerance, a short electrical length, a smooth surface, a large margin space, a dielectric constant adjustment, and the like) advantageous in the transmission and reception operation of the RF signal of the plurality of antenna members 115*a*, antenna performance of the plurality of antenna members 115*a* may be improved.

The dielectric layer 140*a* may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like, and may be formed of a photo imagable dielectric (PID) resin depending on a design. For example, the dielectric layer 140*a* may be formed of a generic copper clad laminate (CCL) or a glass or ceramic based insulating material depending on required material characteristics. Depending on a design, the dielectric layer 140a may be formed of a material having a dielectric constant Dk higher than that of at least one insulating layer 220a of the connection member 200a.

Depending on a design, the antenna package 100a may further include a plurality of director members 110a disposed on the plurality of antenna members 115a and configured to transmit or receive a first RF signal together with the plurality of antenna members 115a. The number of layers on which the plurality of director members 110a are formed may be determined depending on design conditions of a gain and a height of the antenna module. Therefore, the number of layers is not limited to one.

Depending on a design, the antenna package 100a may include a plating member 160a disposed to surround a side surface of each of the feed vias 120a and forming a plurality of cavities. The plurality of cavities may provide the boundary conditions (e.g., a small manufacturing tolerance, a short electrical length, a smooth surface, a large margin space, a dielectric constant adjustment, and the like) advantageous in forming the radiation patterns of the plurality of antenna members 115a, and may improve isolation between the plurality of antenna members 115a.

Depending on a design, the antenna package 100a may further include a cavity ground layer 165a disposed to be adjacent to the connection member 200a. The cavity ground layer 165a may improve isolation between the antenna package 100a and the connection member 200a.

Depending on a design, the antenna package 100a may further include an encapsulation member 150a disposed on the plurality of antenna members 115a. The encapsulation member 150 may be formed of a material that changes to a solid state after it partially permeates into the antenna member 115a while in a liquid state. Accordingly, structural stability of the antenna package 100a may be improved. In addition, the encapsulation member 150 may be formed together with the plurality of director members 110a in a process of forming the encapsulation member 150a. The encapsulation member 150a may be formed of a photo imagable encapsulant (PIE), Ajinomoto build-up film (ABF), epoxy molding compound (EMC), or the like, but is not limited thereto.

Meanwhile, the director members 110a, the antenna members 115a, the feed vias 120a, the plating member 160a, and the cavity ground layer 165a may be formed of a conductive material such as copper (Cu), aluminum (Al), silver (Ag), tin (Sn), gold (Au), nickel (Ni), lead (Pb), titanium (Ti), or an alloy thereof, and may be formed by a plating method such as chemical vapor deposition (CVD), physical vapor deposition (PVD), sputtering, subtractive, additive, semi-additive process (SAP), modified semi-additive process (MSAP), or the like, but is not limited thereto.

Referring to FIG. 2, the connection member 200a may include at least one wiring layer 210a, at least one insulating layer 220a, a wiring via 230a, a connection pad, a passivation layer, and an electrical connection structure, and may have a structure similar to a copper redistribution layer (RDL).

For example, a portion and the remainder of each of at least one wiring layer 210a, at least one insulating layer 220a, and the wiring via 230a included in the connection member 200 may be manufactured independently from each other and may be then connected to each other through the connection pad, the passivation layer, and the electrical connection structure. Depending on a design, since at least one wiring layer 210a, at least one insulating layer 220, and wiring via 230a may be integrally manufactured, the connection pad, the passivation layer, and the electrical connection structure may be omitted.

Referring to FIG. 2, an antenna module according to an exemplary embodiment in the present disclosure may include an IC 300a and a second connection member 390a.

The IC 300a may have an active surface (e.g., an upper surface) electrically connected to at least one wiring layer 210a and an inactive surface (e.g., a lower surface) opposite the active surface, and may transmit the RF signal to the antenna package 100a and receive the RF signal from the antenna package 100a.

The second connection member 390a may include at least one second wiring layer 391a electrically connected to the IC 300a, at least one second insulating layer 392a, and an IC pad 393a directly connected to the IC 300a.

An area of an upper surface of the second connection member 390a may be smaller than that of the lower surface of the connection member 200a. Accordingly, the second connection member 390a may be more easily coupled to the connection member 200a. For example, an antenna module in which at least one wiring layer 210a of the connection member 300a includes a total of three layers and at least one second wiring layer 391a of the second connection member 390a includes a total of three layers may be more stable and have a lower process error rate as compared to a case in which at least one wiring layer 210a of the connection member 200a includes a total of five layers and the second connection member 390a is not disposed.

Therefore, the antenna module according to an exemplary embodiment in the present disclosure may have a stable structure while improving IC performance, antenna performance, and wiring efficiency by securing more wiring layers.

In addition, the second connection member 390a and the connection member 200a may be bonded to each other without using a separate electrical connection structure such as a solder ball. Accordingly, the antenna module according to an exemplary embodiment in the present disclosure may be miniaturized.

Figure 3:
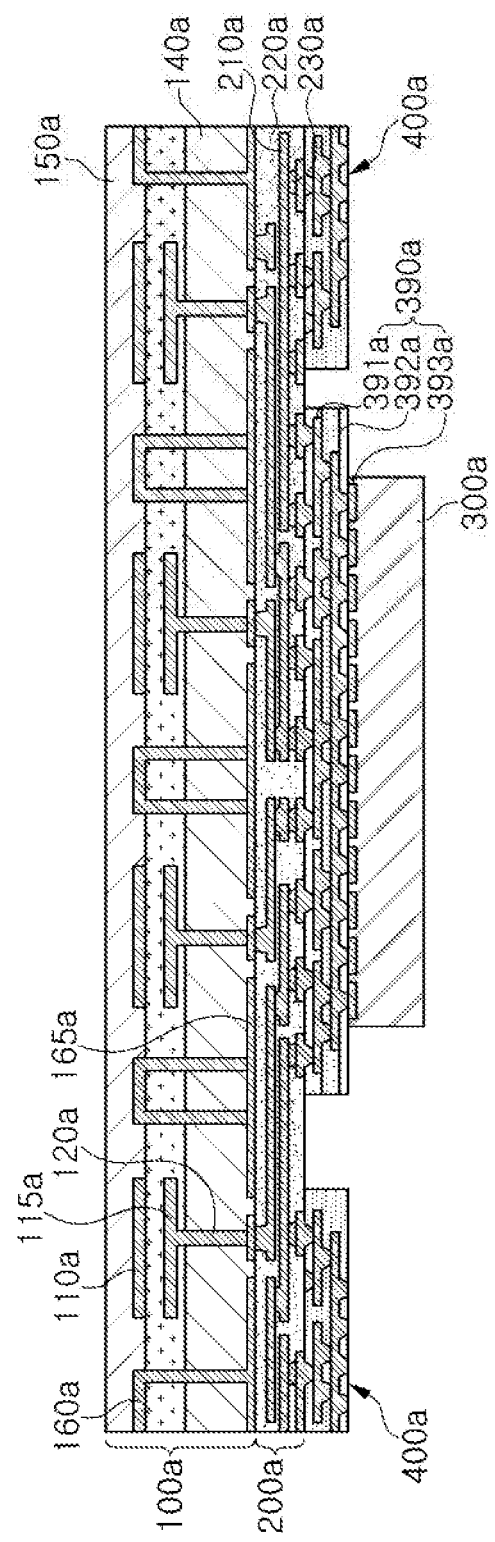
FIG. 3 is a view illustrating a third connection member of the antenna module according to an exemplary embodiment in the present disclosure.

FIG. 3 is a view illustrating a third connection member of the antenna module according to an exemplary embodiment in the present disclosure.

Referring to FIG. 3, the antenna module according to an exemplary embodiment in the present disclosure may include a third connection member 400a disposed on the lower surface of the connection member 200a. Since the third connection member 400a is disposed adjacent to the second connection member 390a, the antenna module according to an exemplary embodiment in the present disclosure may include the third connection member 400a without separately sacrificing a size thereof.

For example, a second IC (not shown) may be disposed on a lower surface of the third connection member 400a and may be electrically connected to a third wiring layer of the third connection member 400a. Accordingly, the second connection member 390a may be optimized for the IC 300a and the third connection member 400a may be optimized for the second IC (not shown).

Figure 4:
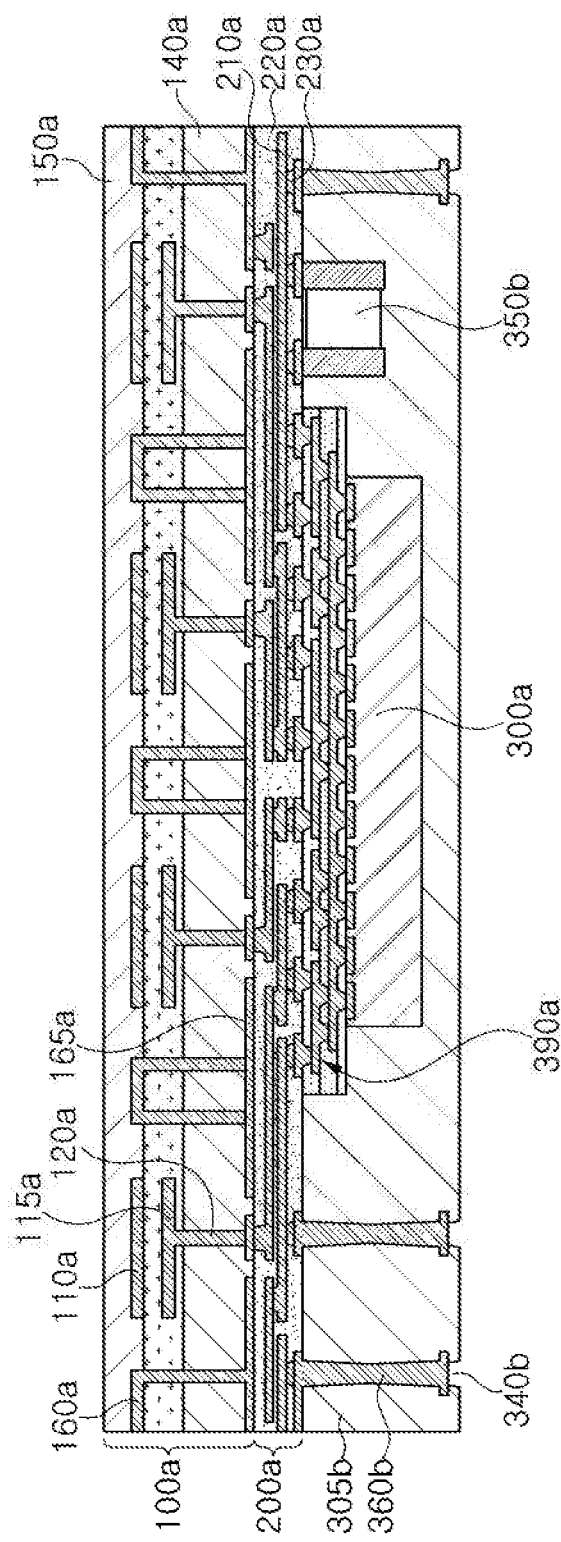
FIG. 4 is a view illustrating a core via and an encapsulant of the antenna module according to an exemplary embodiment in the present disclosure.

FIG. 4 is a view illustrating a core via and an encapsulant of the antenna module according to an exemplary embodiment in the present disclosure.

Referring to FIG. 4, the antenna module according to an exemplary embodiment in the present disclosure may include an encapsulant 305b, an electrical connection structure 340b, a passive component 350b, and a core via 360b.

The encapsulant 305b may encapsulate at least a portion of the IC 300a. The encapsulant 305b may protect the IC 301b from external electrical/physical/chemical impact, and may be formed of a photo imagable encapsulant (PIE), Ajinomoto build-up film (ABF), epoxy molding compound (EMC), or the like, but is not limited thereto.

The electrical connection structure 340b may electrically connect the core via 360b and the outside of the antenna module to each other. For example, the electrical connection structure 340b may have a structure such as a solder ball, a pin, and a land.

Since the core via 360b may electrically connect the electrical connection structure 340b and at least one wiring layer 210a of the connection member 200a to each other, the core via 360b may be used as a pass path of the IF signal or the base band signal.

Figure 5:
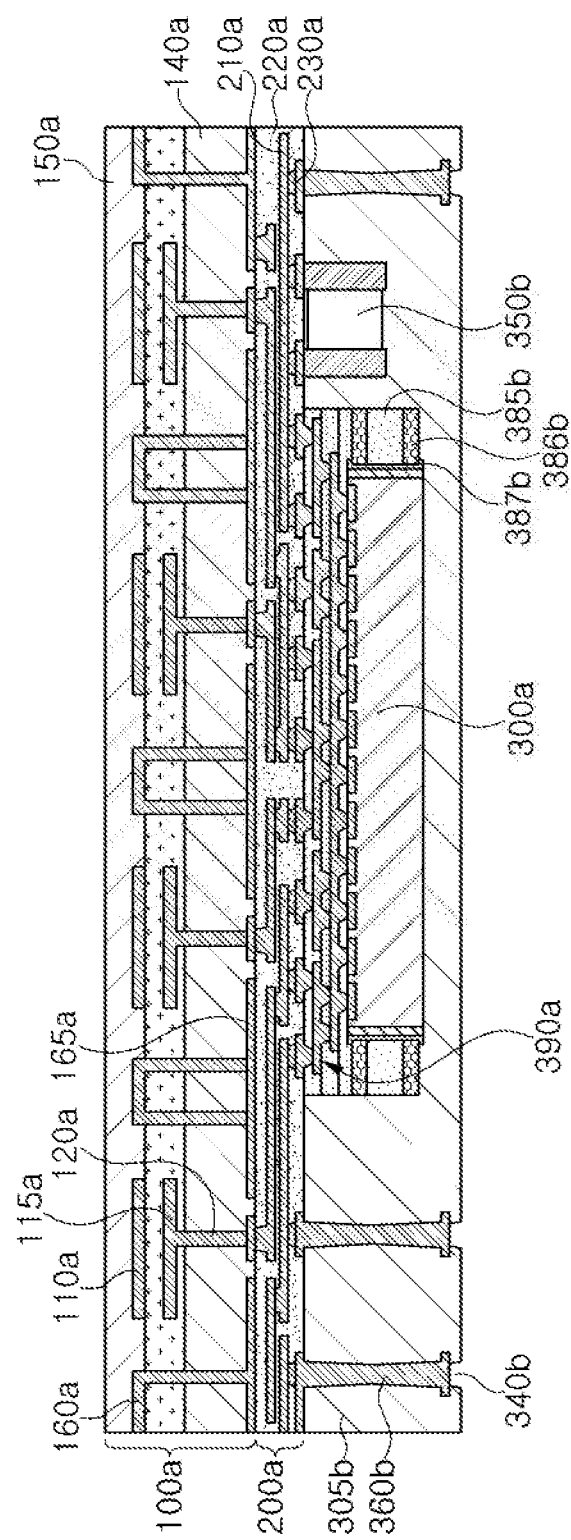
FIG. 5 is a view illustrating a second support member of the antenna module according to an exemplary embodiment in the present disclosure.

FIG. 5 is a view illustrating a second support member of the antenna module according to an exemplary embodiment in the present disclosure.

Referring to FIG. 5, the antenna module according to an exemplary embodiment in the present disclosure may include a second support member 385b disposed on the side surface of the IC 300a and on the lower surface of the second connection member 390a, a second core insulating layer 386b, and a second core plating member 387b disposed on a side surface on the second support member 385b.

Accordingly, the second connection member 390a may be more easily formed from the upper surface of the IC 300a and may be bonded to the connection member in a more balancing way. In addition, isolation between the IC 300a and the core via 360b may be further improved.

Figure 6:
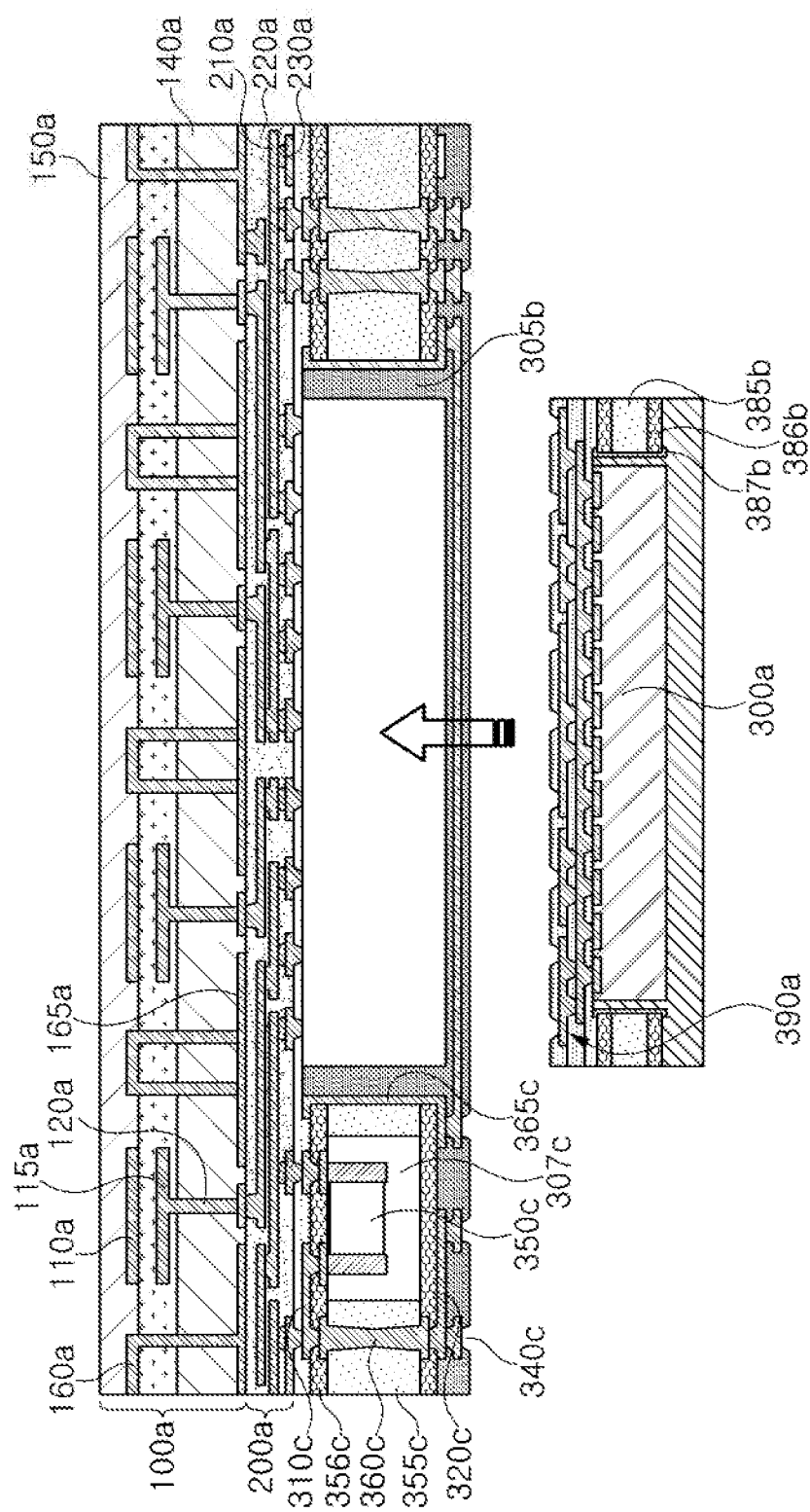
FIG. 6 is a view illustrating a layout of an integrated circuit (IC) cell in the antenna module according to an exemplary embodiment in the present disclosure.

FIG. 6 is a view illustrating a layout of an integrated circuit (IC) cell in the antenna module according to an exemplary embodiment in the present disclosure.

Figure 7:
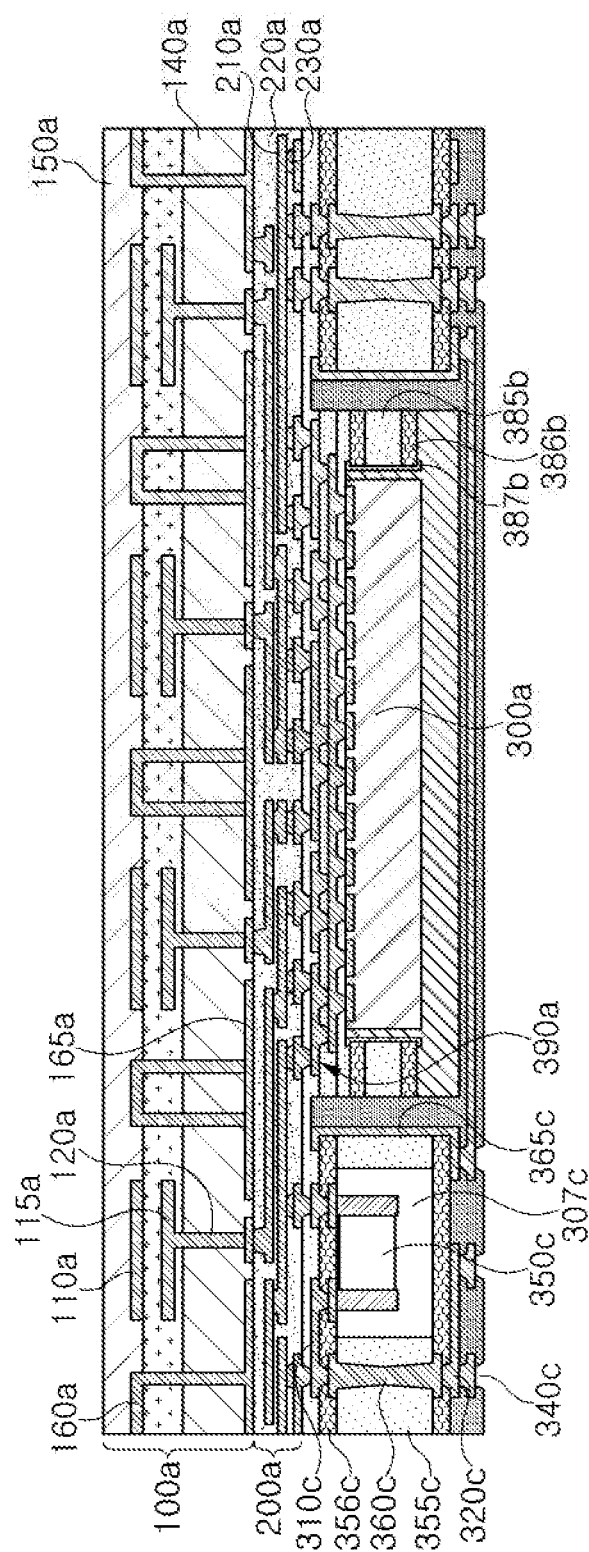
FIG. 7 is a view illustrating a structure in which an IC cell of a first structure is disposed in the antenna module according to an exemplary embodiment in the present disclosure.

FIG. 7 is a view illustrating a structure in which an IC cell of a first structure is disposed in the antenna module according to an exemplary embodiment in the present disclosure.

Referring to FIG. 6, the antenna module according to an exemplary embodiment in the present disclosure may include an upper end wiring layer 310c, a lower end wiring layer 320c, an electrical connection structure 340c, a passive component 350c, a support member 355c, a core via 360c, and a core plating member 365c.

The upper end wiring layer 310c may be disposed on an upper end of the support member 355c or may be disposed to be adjacent to the connection member 200a, and may electrically connect between the active surface of the IC 300a and the core via 360c. Accordingly, the IC 300a may secure a transfer path of the IF signal or the base band signal.

The lower end wiring layer 320c may be disposed on a lower end of the support member 355c and may be electrically connected to the core via 360c.

The passive component 350c may be disposed on the lower surface of the connection member 200a and may be disposed in an accommodating space 307c of the support member 355c. The accommodating space 307c may be filled with the same material as that of the encapsulant 305b.

The support member 355c may include at least one core wiring layer, at least one core insulating layer 356c, and a core via 360c. The core via 360c may be a pass path of the IF signal or the base band signal.

That is, the IF signal or the base band signal may pass through the electrical connection structure 340c, the core via 360c, the upper end wiring layer 310c, and the IC 300a in this order.

The core plating member 365c may be disposed on a side surface of the support member 355c in a direction from the support member 355c to the IC 300a. Since the core plating member 365c may improve isolation between the IC 300a and the support member 355c, noise of the IF signal or the base band signal may be reduced. In addition, the core plating member 365c may efficiently radiate heat generated from the IC 300a to the outside of the antenna module.

Referring to FIGS. 6 and 7, the antenna module according to an exemplary embodiment in the present disclosure may be implemented by inserting a cell formed by the second connection member 390a, the IC 300a, the second support member 385b, the second core insulating layer 386b, the second core plating member 387b, and the encapsulant thereinto. Accordingly, the second connection member 390a may be more easily coupled to the connection member 200a.

In addition, since the second connection member 390a is disposed on the side surface of the support member 355c, the antenna module according to an exemplary embodiment in the present disclosure may increase the number of wiring layers without separately increasing a size thereof due to an addition of the second connection member 390a, and may thus have a high level of antenna performance and have a structure that is easy to miniaturize.

Meanwhile, depending on a design, the antenna module according to an exemplary embodiment in the present disclosure may include a dummy member (not shown) disposed between the support member 355c and the second connection member 390a and disposed on the lower surface of the connection member 200a. Accordingly, since the lower surface of the connection member 200a may be more structurally stabilized, durability of the antenna module may be improved.

Figure 8:
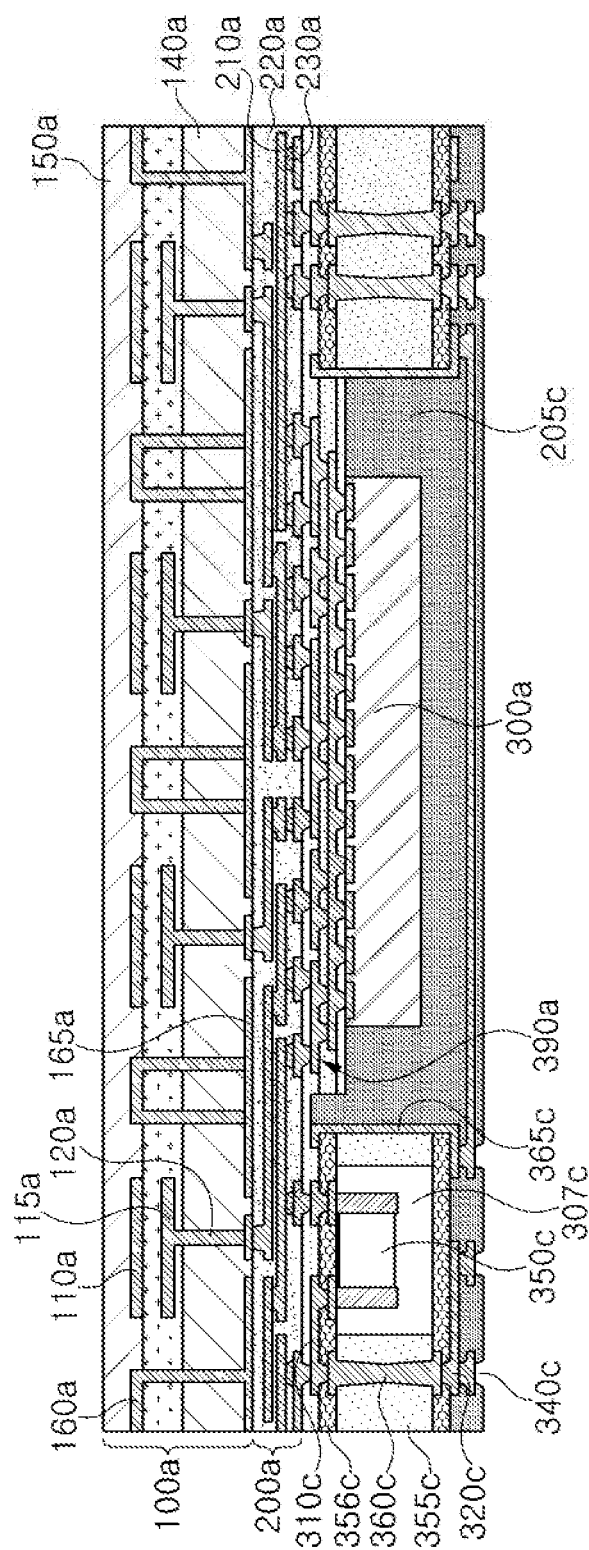
FIG. 8 is a view illustrating a structure in which an IC cell of a second structure is disposed in the antenna module according to an exemplary embodiment in the present disclosure.

FIG. 8 is a view illustrating a structure in which an IC cell of a second structure is disposed in the antenna module according to an exemplary embodiment in the present disclosure.

Referring to FIG. 8, the second support member, the second core insulating layer, and the second core plating member may be omitted.

Figure 9:
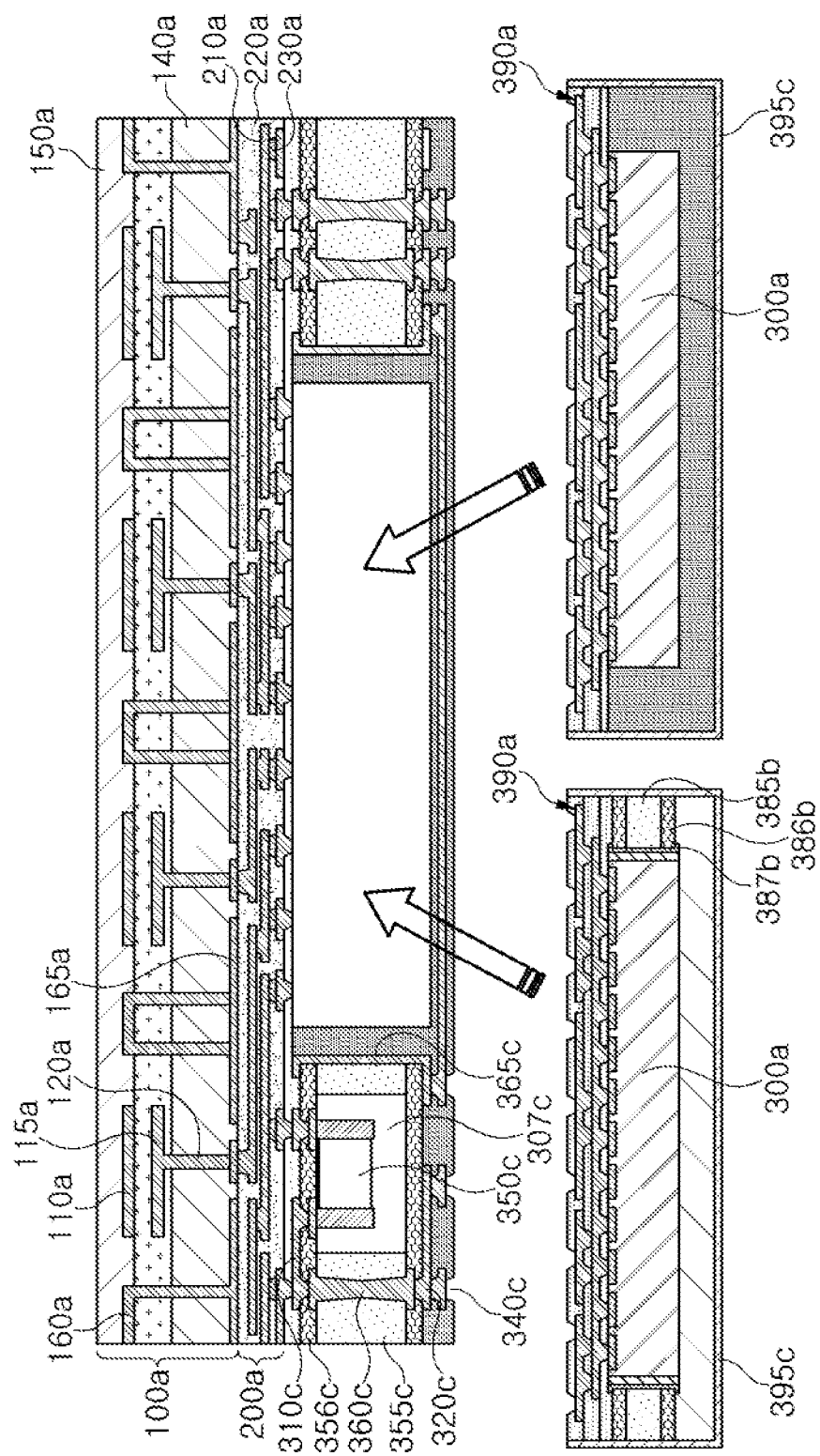
FIG. 9 is a view illustrating a cell shielding member in the antenna module according to an exemplary embodiment in the present disclosure.

FIG. 9 is a view illustrating a cell shielding member in the antenna module according to an exemplary embodiment in the present disclosure.

Referring to FIG. 9, the antenna module according to an exemplary embodiment in the present disclosure may include a cell shielding member 395c covering side surfaces and a lower surface of a cell formed by the second connection member 390a, the IC 300a, the second support member 385b, the second core insulating layer 386b, the second core plating member 387b, and the encapsulant.

Accordingly, isolation between the IC 300a and the core via 360c may be further improved and structural stability in a process of bonding the cell may also be improved.

Figure 10A:
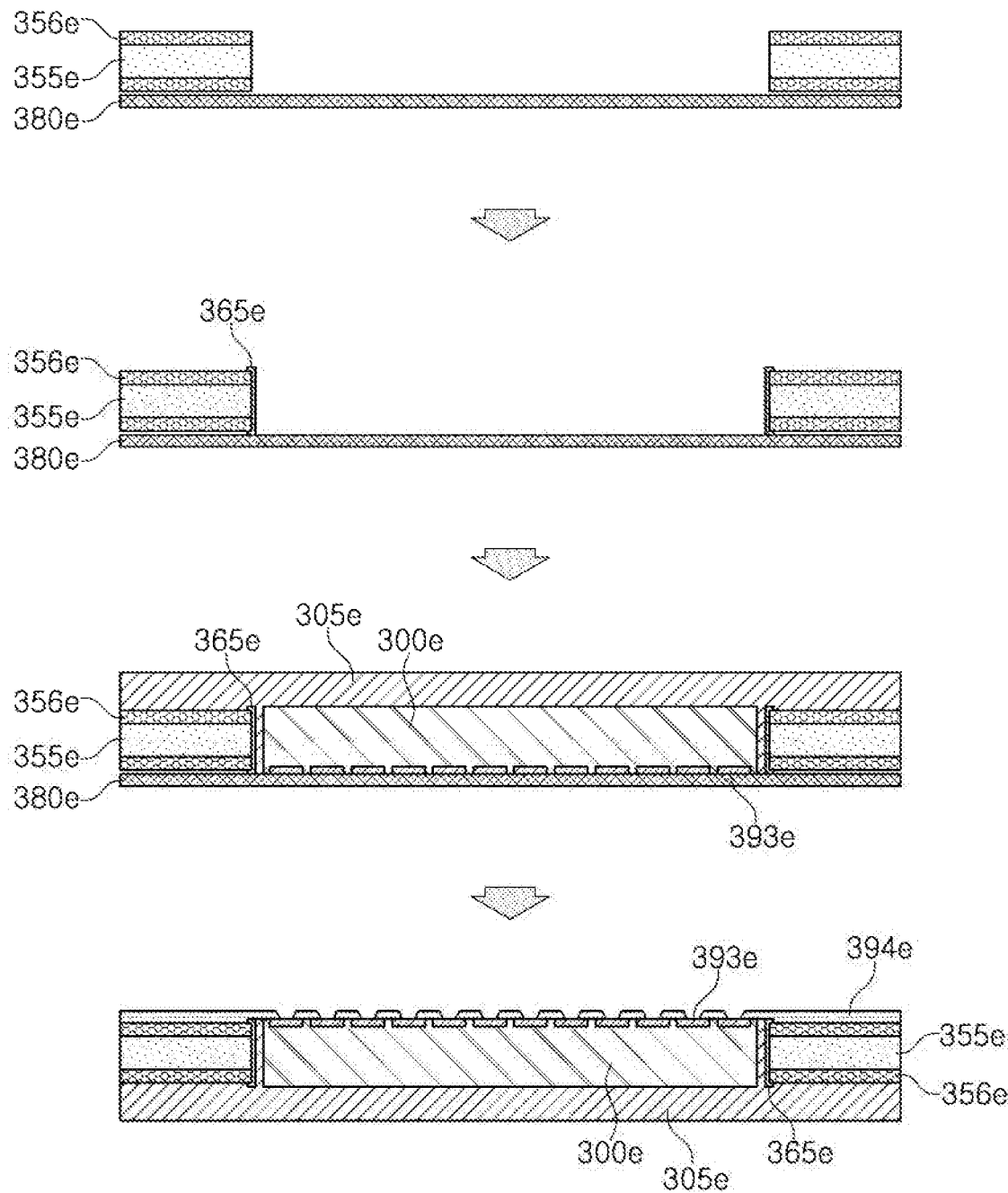
FIGS. 10A and 10B are views illustrating a process of manufacturing a cell of an antenna module according to an exemplary embodiment in the present disclosure.
Figure 10B:
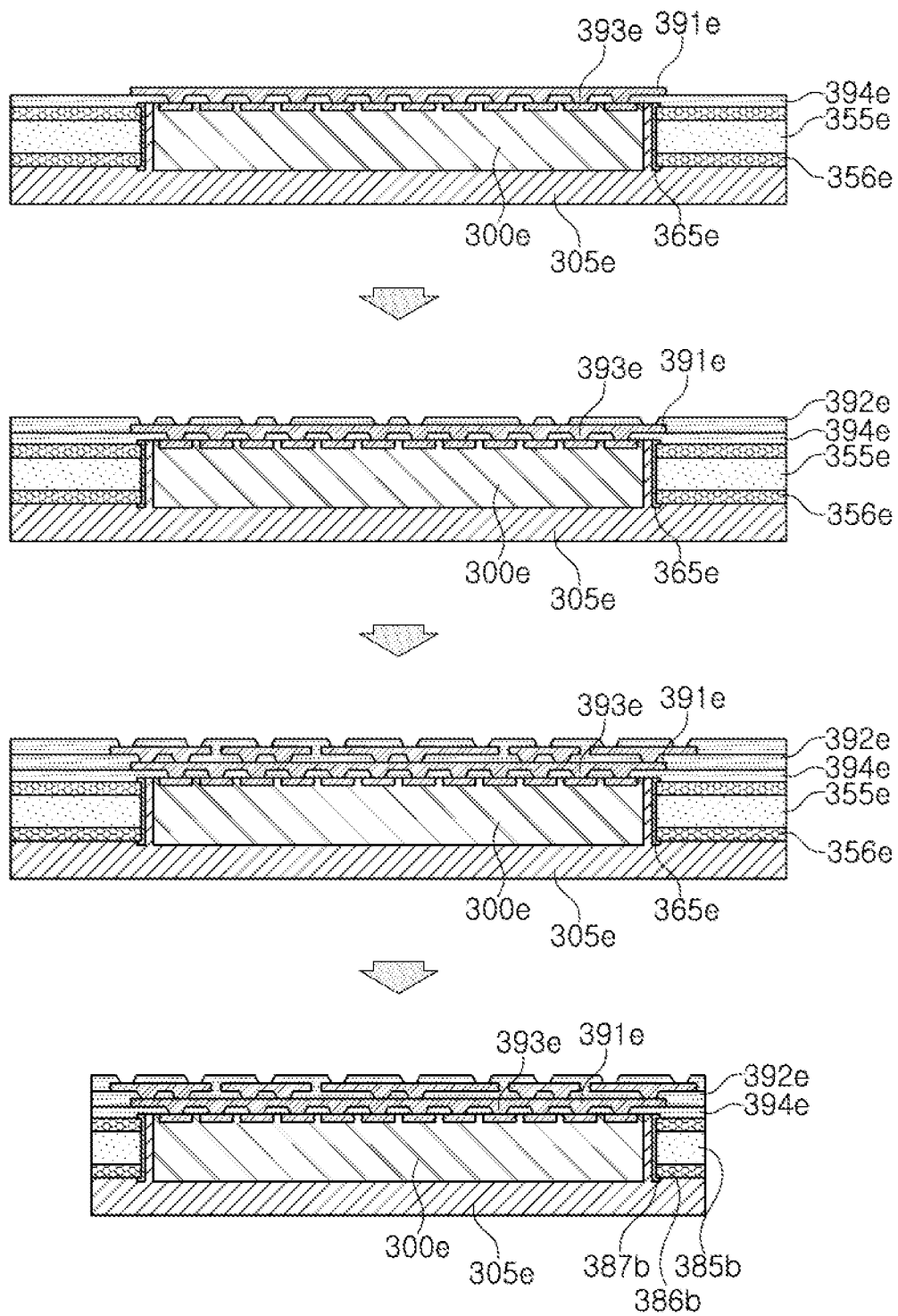

FIGS. 10A and 10B are views illustrating a process of manufacturing a cell of an antenna module according to an exemplary embodiment in the present disclosure.

Referring to FIG. 10A, a support member 355e and a core insulating layer 356e may be provided on a film 380e with at least one IC accommodating space. Next, a core plating member 365e may be formed on a side surface of the region formed by the support member 355e and the core insulating layer 356e. Next, an IC 300e may be disposed in the IC accommodating space such that the active surface of the IC 300e faces the film 380e. An encapsulant 305e may encapsulate at least a portion of the IC 300e. Next, the antenna module may be flipped upside down. Next, the film 380e may be removed and an IC pad 393e and a second insulating layer 394e may be disposed on an upper surface of the IC 300e.

Referring to FIG. 10B, a second wiring layer 391e and a second insulating layer 392e may be disposed on upper surfaces of the IC pad 393e and the second insulating layer 394e, respectively. Next, at least a portion of each of the support member 355e, the core insulating layer 356e, and the second insulating layers 392e and 394e may be removed. Accordingly, a cell of the antenna module may be completed.

Here, the support member 355e of which the portion is removed, the core insulating layer 356e of which the portion is removed, and the core plating member 365e may be configured as the second support member 385b, the second core insulating layer 386b, and the second core plating member 387b, respectively, in the antenna module.

Figure 11:
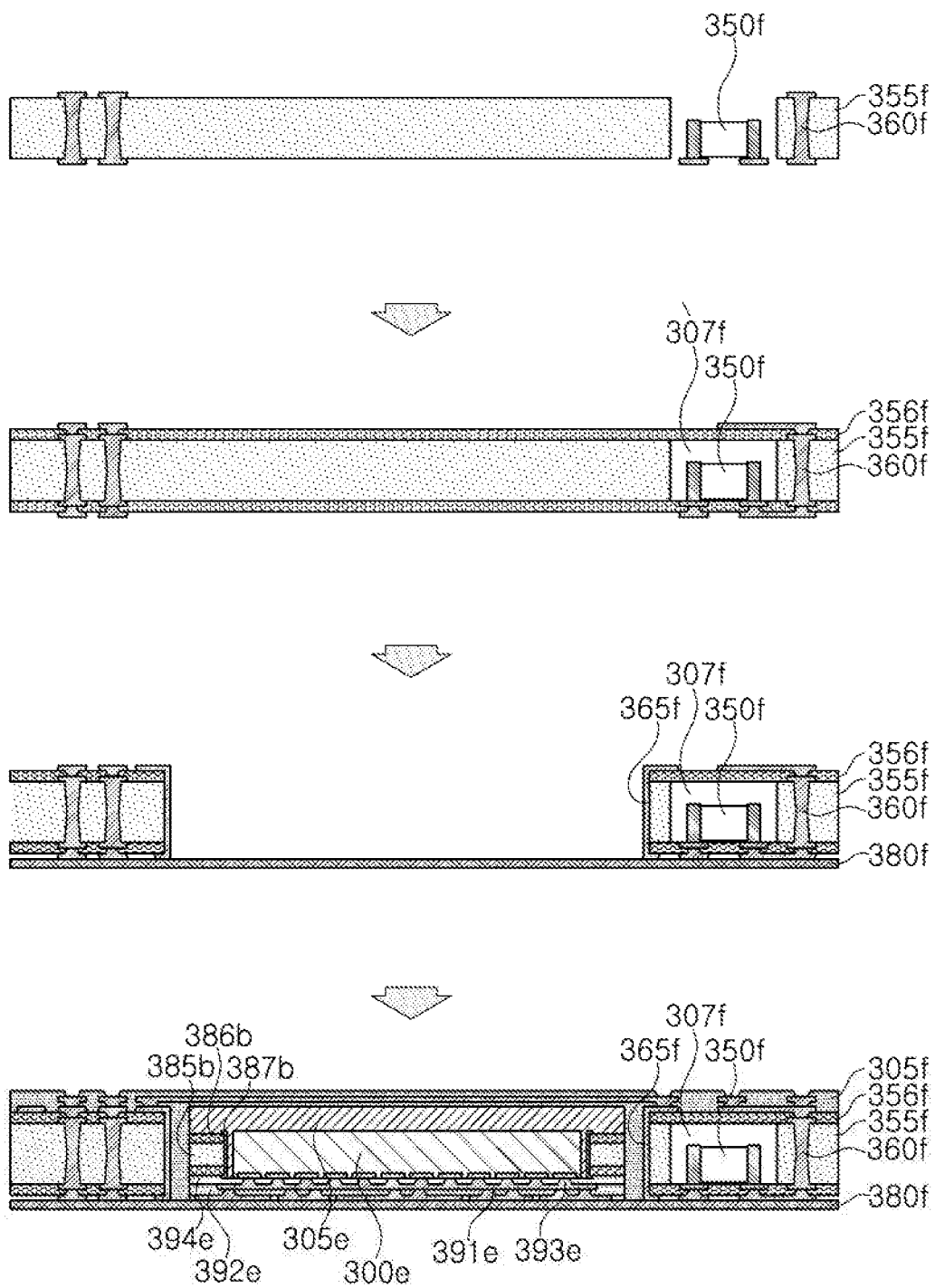
FIG. 11 is a view illustrating a process of manufacturing an antenna module according to an exemplary embodiment in the present disclosure.

FIG. 11 is a view illustrating a process of manufacturing an antenna module according to an exemplary embodiment in the present disclosure.

Referring to FIG. 11, a support member 355f may provide with at least one hole and accommodating space, a core via 360f may be formed in at least one hole of the support member 355f, and a passive component 350f may be disposed in the accommodating space.

A core insulating layer 356f may be formed on an upper surface and a lower surface of the support member 355f.

A support member 355f may be provided on a film 380f. A region of the support member 355f in which a cell is to be disposed may be removed and a core plating member 365f may be formed on aside surface of the region. The cell may be disposed on the region.

The cell may be encapsulated by an encapsulant 305f. Next, the antenna module may be rotated. Next, an antenna package and a connection member may be disposed on an upper surface of the antenna module.

Figure 12:
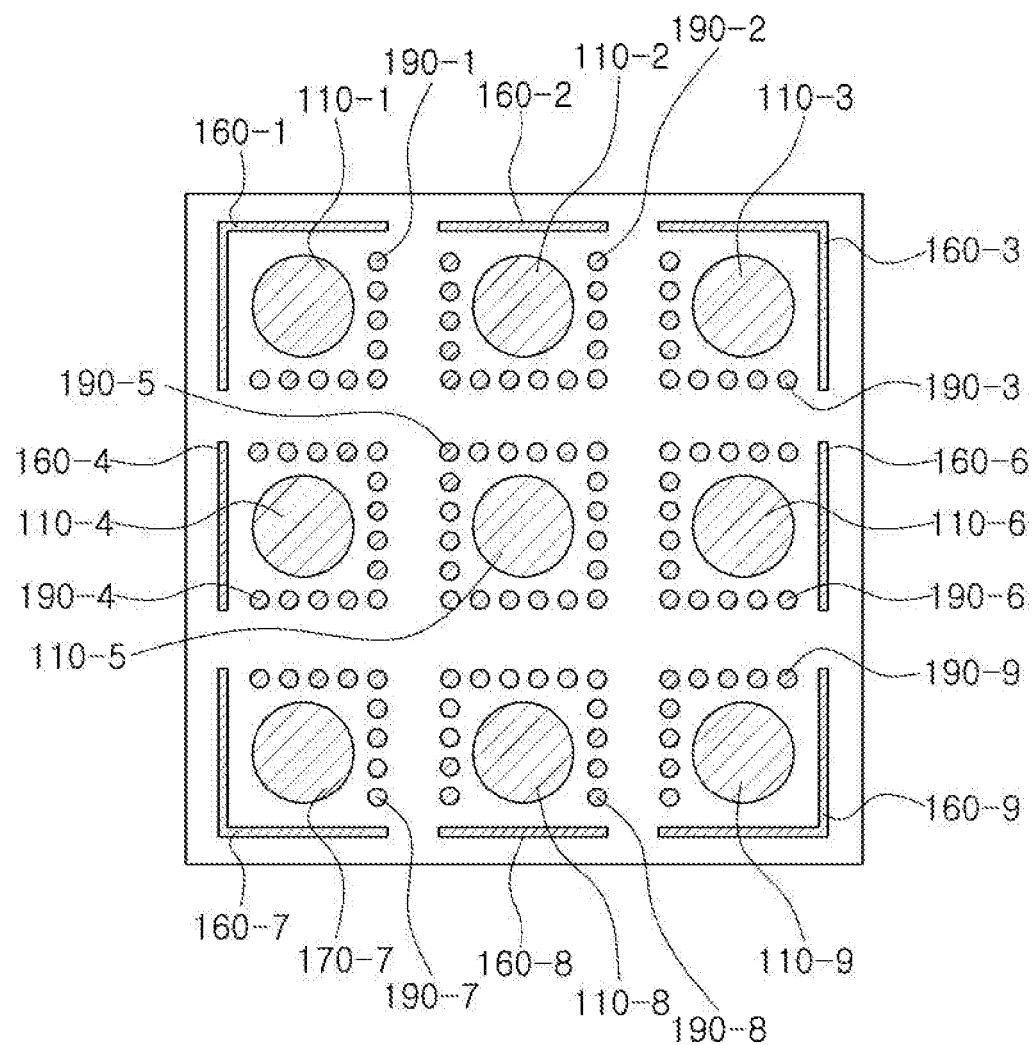
FIG. 12 is a view illustrating an upper surface of the antenna module according to an exemplary embodiment in the present disclosure.

FIG. 12 is a view illustrating an upper surface of an antenna module according to an exemplary embodiment in the present disclosure.

Referring to FIG. 12, each of a plurality of director members 110-1, 110-2, 110-3, 110-4, 110-5, 110-6, 110-7, 110-8, and 110-9 may be surrounded by at least one of corresponding plating members 160-1, 160-2, 160-3, 160-4, 160-6, 160-7, 160-8, and 160-9, and a plurality of shielding vias 190-1, 190-2, 190-3, 190-4, 190-5, 190-6, 190-7, 190-8, and 190-9. If the antenna module does not include the plurality of director members, the plurality of director members 110-1, 110-2, 110-3, 110-4, 110-5, 110-6, 110-7, 110-8, and 110-9 may be replaced with a plurality of antenna members.

Meanwhile, the number, layout, and shape of the plurality of director members or the plurality of antenna members illustrated in FIG. 12 are not particularly limited. For example, the number of the plurality of antenna members illustrated in FIG. 12 may be four or sixteen.

Meanwhile, a plurality of shielding vias illustrated in FIG. 12 may be replaced with plating members and the plating members illustrated in FIG. 12 may also be replaced with the plurality of shielding vias.

Figure 13A:
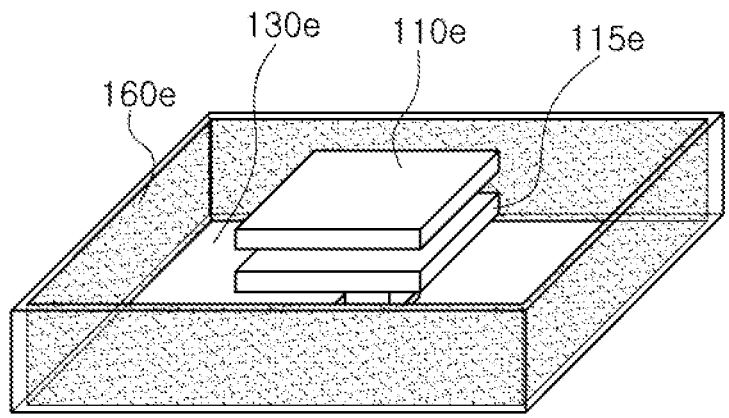
FIGS. 13A through 13C are perspective views each illustrating an example of a cavity of an antenna package of the antenna module according to an exemplary embodiment in the present disclosure.
Figure 13B:
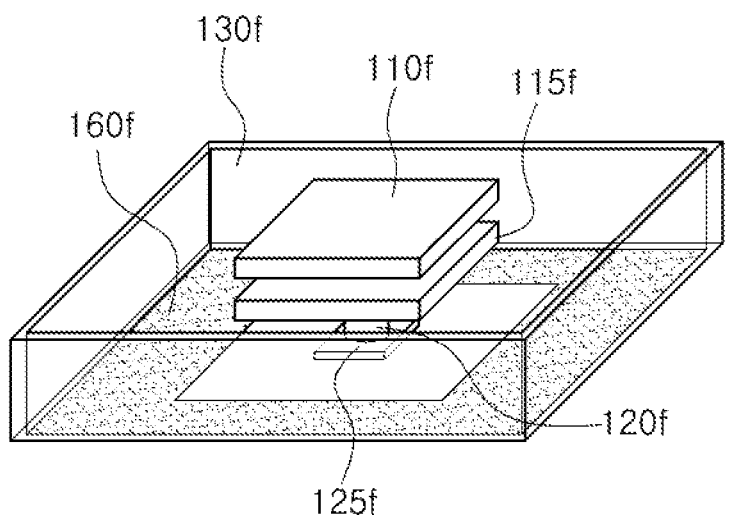
Figure 13C:
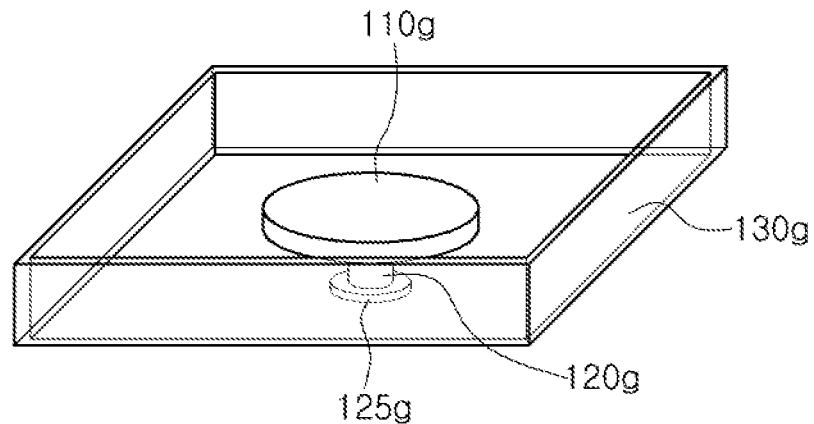

FIGS. 13A through 13C are perspective views each illustrating an example of a cavity of an antenna package according to an exemplary embodiment in the present disclosure.

Referring to FIG. 13A, a cavity may include at least portions of a director member 110e, an antenna member 115e, a feed via 120e, an electrical connection structure, a dielectric layer 130e, and a plating member 160e. Here, the plating member 160e may be disposed to surround side surfaces of the cavity. That is, a lower surface of the cavity may be covered by a ground pattern disposed on an upper surface of the connection member.

Referring to FIG. 13B, the cavity may include at least portions of a director member 110f, an antenna member 115f, a feed via 120f, an electrical connection structure 125f, a dielectric layer 130f, and a plating member 160f. Here, the plating member 160f may be disposed to cover a portion of the lower surface of the cavity. That is, the side surfaces of the cavity may be surrounded by the plating member disposed on side surfaces of an insulating member on the connection member. Accordingly, isolation between the connection member and the IC of the antenna package may be improved.

Referring to FIG. 13C, the cavity may include at least portions of an antenna member 110g, a feed via 120g, an electrical connection structure 125g, and a dielectric layer 130g. That is, the side surfaces of the cavity may be surrounded by the plating member disposed on the side surfaces of the insulating member on the connection member, and the lower surface of the cavity may be covered by the ground pattern disposed on the upper surface of the connection member.

Meanwhile, the electrical connection structures 125f and 125g may be connected to a corresponding wire of at least one wiring layer of the connection member when the antenna package and the connection member are coupled to each other. For example, the electrical connection structures 125f and 125g may be implemented in electrodes, pins, solder balls, lands, and the like.

Figure 14:
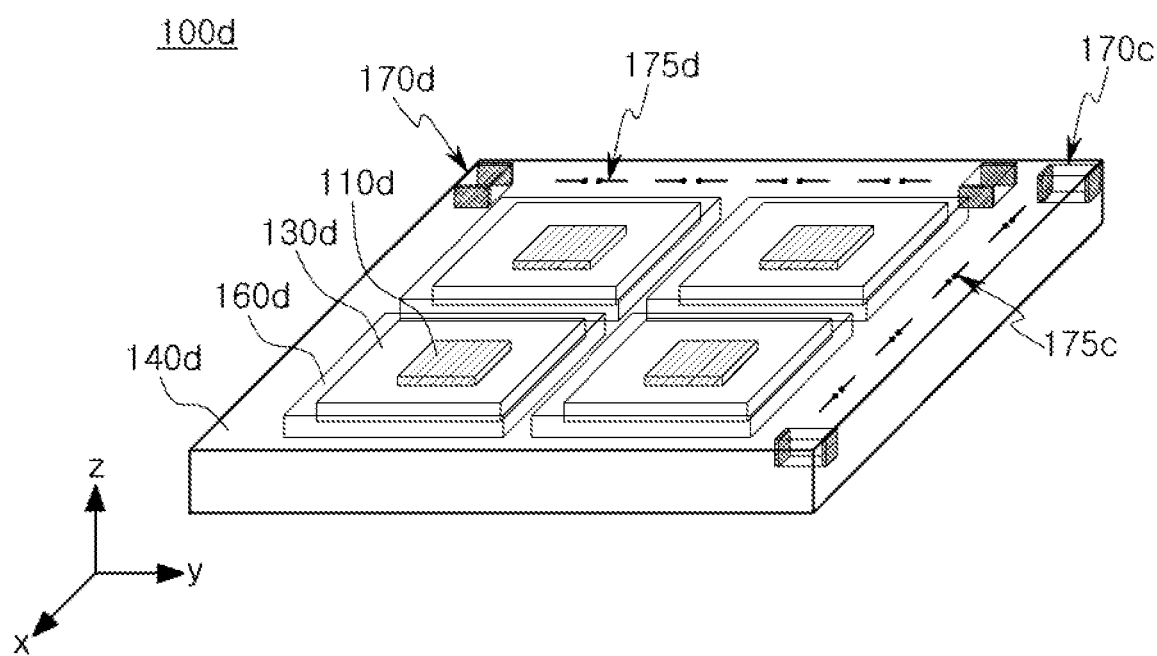
FIG. 14 is a perspective view illustrating an example of an antenna package of the antenna module according to an exemplary embodiment in the present disclosure.

FIG. 14 is a perspective view illustrating an example of an antenna package according to an exemplary embodiment in the present disclosure.

Referring to FIG. 14, since an antenna package may include a plurality of director members 110d, a cavity 130d, a dielectric layer 140d, a plating member 160d, a plurality of second directional antennal member 170c and 170d, and a plurality of dipole antennas 175c and 175d, the antenna module according to an exemplary embodiment in the present disclosure may omni-directionally form a radiation pattern.

The plurality of director members 110d may transmit and receive an RF signal in a z axis direction together with corresponding antenna members.

A plurality of second directional antenna members 170c and 170d may be disposed to be adjacent to an edge of the antenna package and to be stood up in the z axis direction, and one of the plurality of directional antennas 170c and 170d may transmit and receive a second RF signal in an x axis direction and the other thereof may transmit and receive the second RF signal in a y axis direction.

A plurality of dipole antennas 175c and 175d may be disposed between the dielectric layer 140d and an encapsulation member to be adjacent to the edge of the antenna package, and one of the plurality of dipole antennas 175c and 175d may transmit and receive a third RF signal in the x axis direction and the other thereof may transmit and receive the third RF signal in the y axis direction. Depending on a design, at least a portion of the plurality of dipole antennas 175c and 175d may be replaced with a monopole antenna.

Meanwhile, the connection member, the support member, the core via, the IC, and the absorption member may be implemented according to a fan-out semiconductor package to be described below. To facilitate understanding of the fan-out semiconductor package, a description will be made with reference to FIGS. 15 through 22.

Figure 15:
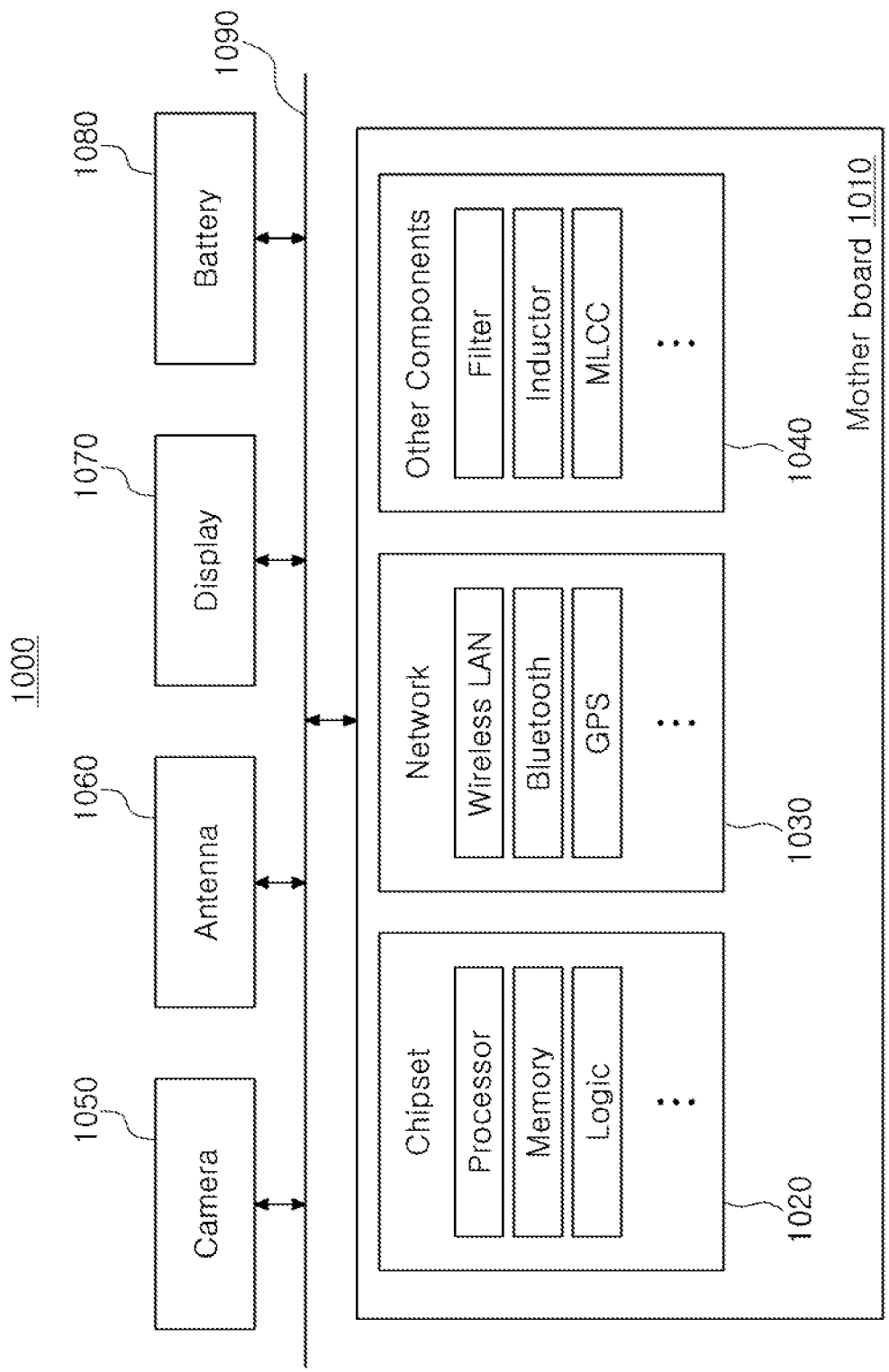
FIG. 15 is a schematic block diagram illustrating an example of an electronic device system.

FIG. 15 is a block diagram schematically illustrating an example of an electronic device system.

Referring to FIG. 15, an electronic device 1000 accommodates a mother board (or mother substrate) 1010. The mother board 1010 is physically and/or electrically connected to a chip-related component 1020, a network-related component 1030, and other component 1040. The components are also combined with any other electronic component (to be described later) to form various signal lines 1090.

The chip-related component 1020 includes a memory chip such as a volatile memory (e.g., a DRAM), a non-volatile memory (e.g., a ROM), a flash memory, and the like, an application processor chip such as a central processor (e.g., a CPU), a graphics processor (e.g., GPU), a digital signal processor, a cryptographic processor, a microprocessor, a micro-controller, and the like, a logic chip such as an analog-to-digital converter, an application-specific IC (ASIC), and the like, but the chip-related component 1020 is not limited thereto and may include any other types of chip-related electronic component. Also, these electronic components 1020 may be combined with each other.

The network-related component 1030 may include Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter. However, the network-related component 1030 is not limited thereto and any other among a plurality of wireless or wired standards or protocols. Also, the network-related component 1030 may be combined with the chip-related electronic component 1020.

The other component 1040 includes a high-frequency inductor, a ferrite inductor, a power inductor, a ferrite bead, a Low Temperature Co-Fired Ceramic (LTCC), an Electro Magnetic Interference (EMI) filter, a Multilayer Ceramic Condenser (MLCC), and the like, but is not limited thereto and may include passive components used for various other purposes. It is also to be understood that other components 1040 may be combined with each other in conjunction with the chip-related electronic component 1020 and/or the network-related electronic component 1030.

According to types of electronic device 1000, the electronic device 1000 may include other electronic components that may or may not be physically and/or electrically connected to the mother board 1010. The other electronic components include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (e.g., a hard disk drive) (not shown), a compact disk (CD) (not shown), a digital versatile disk (DVD) (not shown), and the like. However, the other electronic components are not limited thereto and may include other electronic components used for various purposes according to types of the electronic device 1000.

The electronic device 1000 may be a smart phone, a personal digital assistant (PDA), a digital video camera, a digital still camera, a network system, a computer, a monitor, a tablet, a laptop, a netbook, a television, a video game, a smart watch, an automotive, and the like. However, the electronic device 1000 is not limited thereto and may be any other electronic device that processes data.

Figure 16:
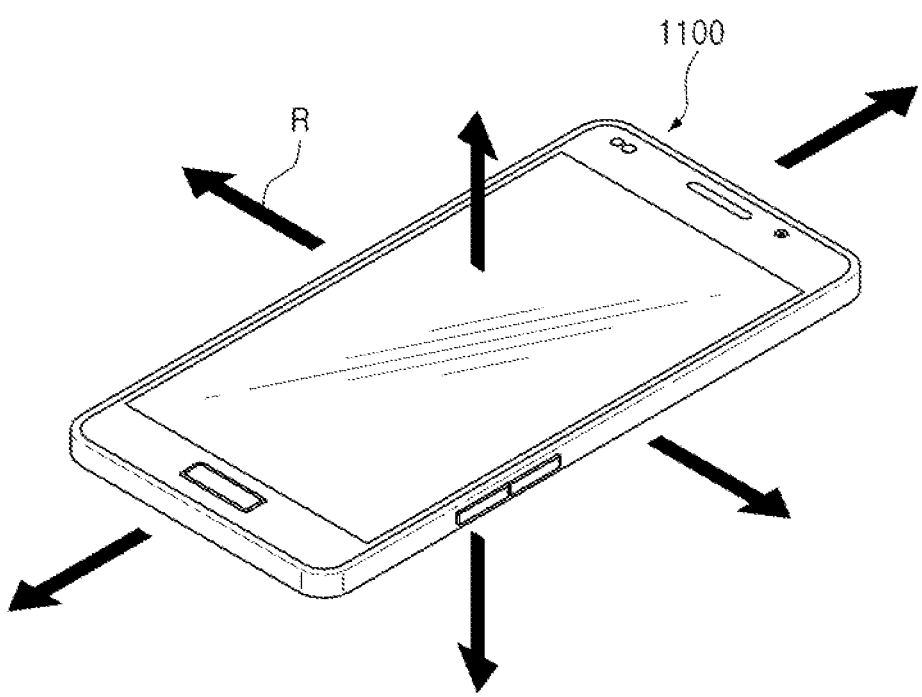
FIG. 16 is a schematic perspective view illustrating an example of an electronic device.

FIG. 16 is a perspective view schematically illustrating an example of an electronic device.

Referring to FIG. 16, the electronic device may be, for example, a smartphone 1100. A radio frequency integrated circuit (RF IC) may be applied in the form of a semiconductor package to the smartphone 1100, and an antenna may be applied in the form of a substrate or a module. As the RF IC and an antenna are electrically connected in the smartphone 1100, an antenna signal may be radiated (R) in various directions. The semiconductor package including the RF IC and the substrate or module including the antenna may be applied in various forms to an electronic device such as a smartphone, or the like.

Generally, a semiconductor chip has many microelectronic circuits integrated therein, but the semiconductor chip itself may not serve as a finished semiconductor product and has a possibility of being damaged by an external physical or chemical impact. Therefore, the semiconductor chip itself is not used as is but is packaged so that the semiconductor chip in a package state is used in an electronic device.

The reason that the semiconductor packaging is required, is because there is a difference in circuit width between the semiconductor chip and the mother board of the electronic device from the viewpoint of electrical connection. Specifically, in the case of the semiconductor chip, sizes of the connection pads and a spacing between the connection pads are very small. Meanwhile, in the case of a mother board used in an electronic device, a size of an electronic component mounting pad and a spacing between the electronic component mounting pads are much bigger than a scale of the semiconductor chip. Therefore, it may be difficult to directly mount the semiconductor chip on such a mother board, and a packaging technique which may buffer the difference in circuit width therebetween is required.

The semiconductor package manufactured by such a packaging technique may be classified as a fan-in semiconductor package and a fan-out semiconductor package according structures and purposes.

Hereinafter, the fan-in semiconductor package and the fan-out semiconductor package will be described in detail with reference to the accompanying drawings.

Figures 17A, 17B:
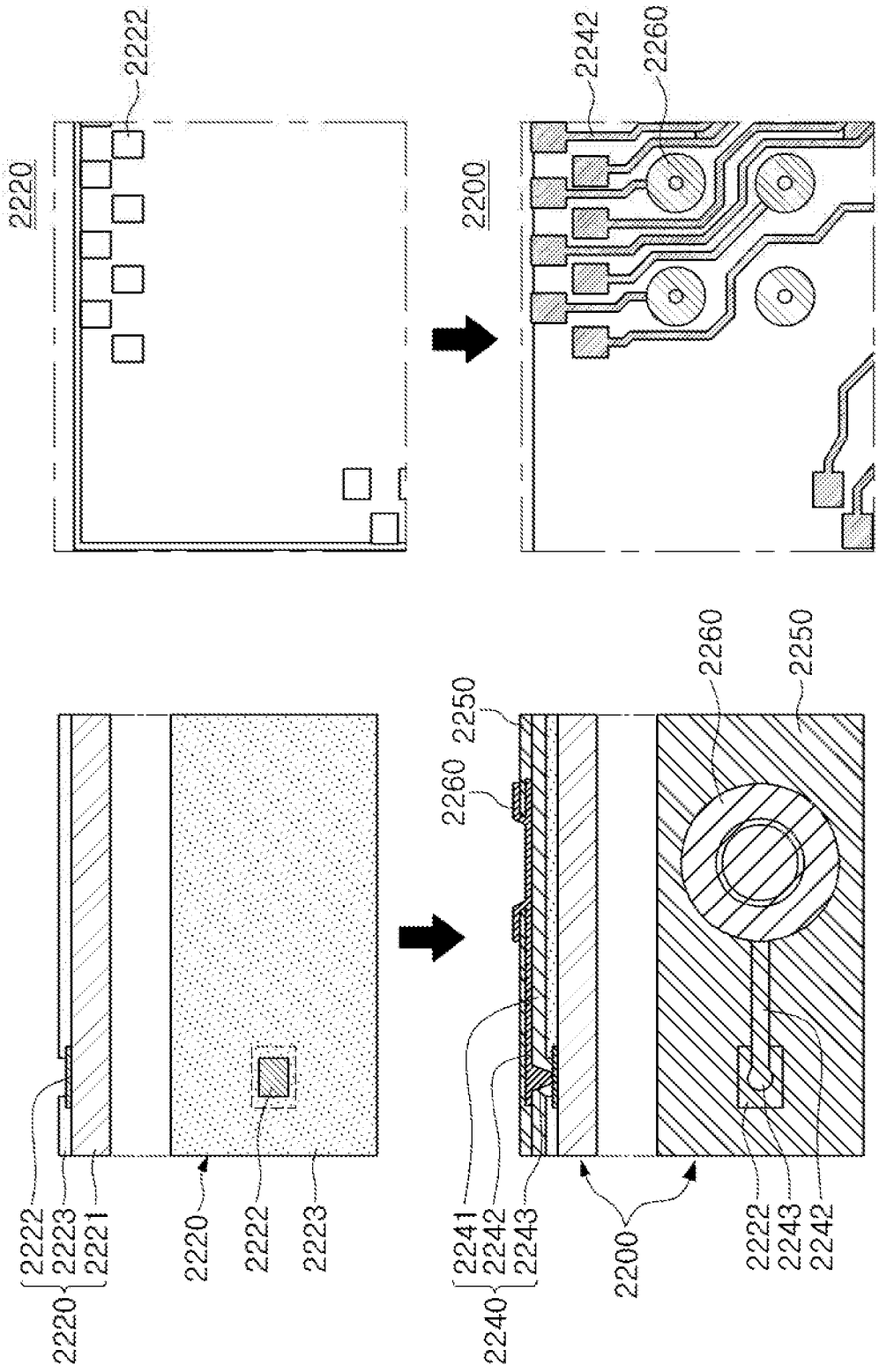
FIGS. 17A and 17B are a schematic cross-sectional view illustrating states of a fan-in semiconductor package before and after being packaged.

FIGS. 17A and 17B are a cross-sectional view schematically illustrating states before and after packaging a fan-in semiconductor package.

Figure 18:
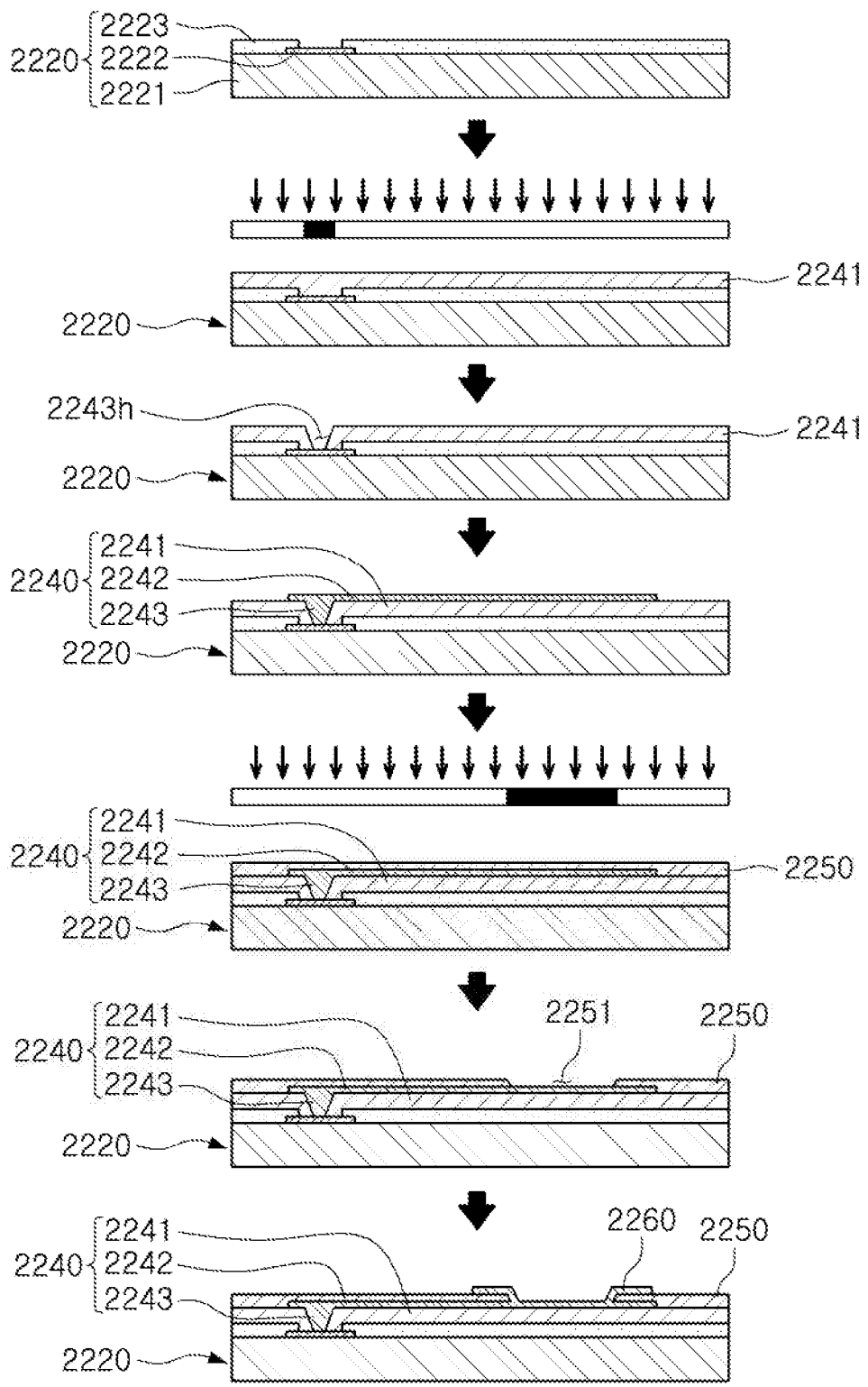
FIG. 18 is schematic cross-sectional views illustrating a packaging process of a fan-in semiconductor package.

FIG. 18 is a cross-sectional view schematically illustrating a packaging process of a fan-in semiconductor package.

Referring to FIGS. 17A, 17B and 18, a semiconductor chip 2220 may be, for example, a bare integrated circuit (IC) including a body 2221 including silicon (Si), germanium (Ge), a gallium arsenide (GaAs), and the like, a connection pad 2222 formed on one surface of the body 2221 and including a conductive material such as aluminum (Al), or the like, and a passivation film 2223 such as an oxide film or a nitride film formed on one surface of the body 2221 and covering at least a portion of the connection pads 2222. Here, since the connection pad 2222 is very small, it is difficult for the IC to be mounted even on a medium-level PCB, let alone a mother board of an electronic device, and the like.

In order to rewire the connection pad 2222, a connection member 2240 is formed on the semiconductor chip 2220 according to a size of the semiconductor chip 2220. The connection member 2240 may be formed by forming an insulating layer 2241 with an insulating material such as a photosensitive insulating resin (PID) on the semiconductor chip 2220, forming a via hole 2243*h* opening the connection pad 2222, and subsequently forming a wiring pattern 2242 and a via 2243. Thereafter, a passivation layer 2250 for protecting the connection member 2240 is formed, an opening 2251 is formed, and an underbump metallization layer 2260, or the like, is subsequently formed. That is, through a series of processes, a fan-in semiconductor package 2200 including, for example, the semiconductor chip 2220, the connection member 2240, the passivation layer 2250, and the underbump metallization layer 2260 is manufactured.

As described above, the fan-in semiconductor package may be in the form of a package in which the connection pads of the semiconductor chip, for example, input/output (I/O) terminals are all disposed inside the device, may have good electrical properties, and may be produced at low cost. Accordingly, many devices to be disposed in a smartphone are manufactured in the form of the fan-in semiconductor package and development is being made toward realization of a small size and fast signal transmission.

However, in the fan-in semiconductor package, all of the I/O terminals must be disposed inside the semiconductor chip, so that there are many space limitations. Therefore, such a structure is difficult to apply to a semiconductor chip having a large number of I/O terminals or a semiconductor chip having a small size. In addition, due to the vulnerability, the fan-in semiconductor package may not be directly mounted on a mother board of an electronic device. Although the size and spacing of the I/O terminals of the semiconductor chip are enlarged by a rewiring process, the I/O terminals may not have a size and spacing enough to be directly mounted on the mother board of the electronic device.

Figure 19:
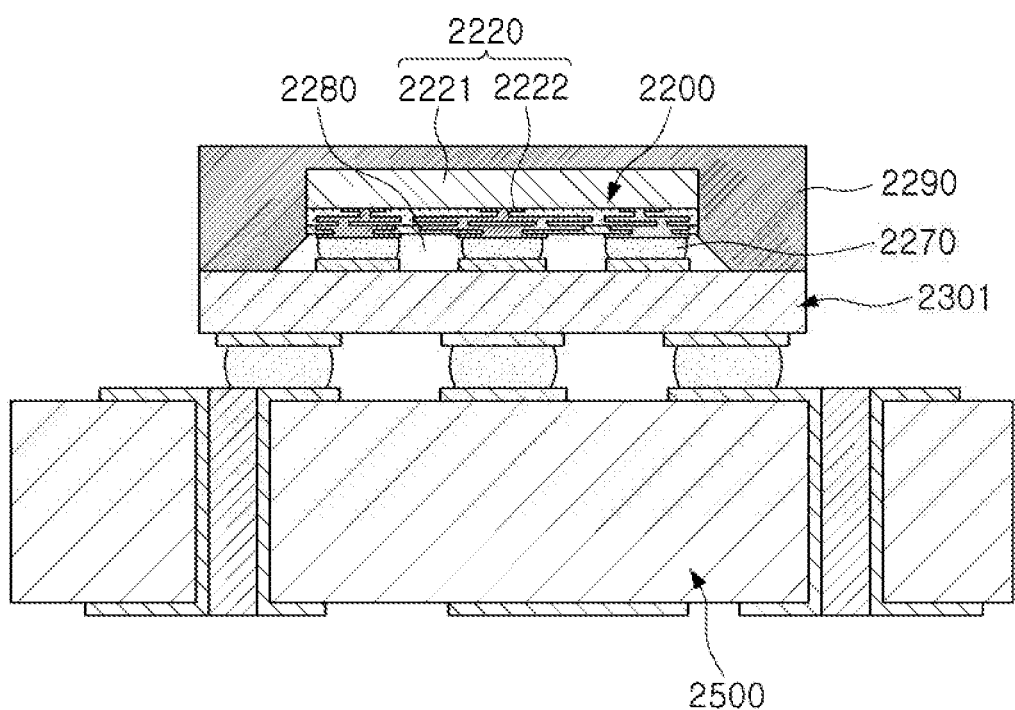
FIG. 19 is a schematic cross-sectional view illustrating a case in which a fan-in semiconductor package is mounted on an interposer substrate and is finally mounted on a mother board of an electronic device.

FIG. 19 is a cross-sectional view schematically illustrating a case where a fan-in semiconductor package is mounted on an interposer substrate and ultimately mounted on a mother board of an electronic device.

Figure 20:
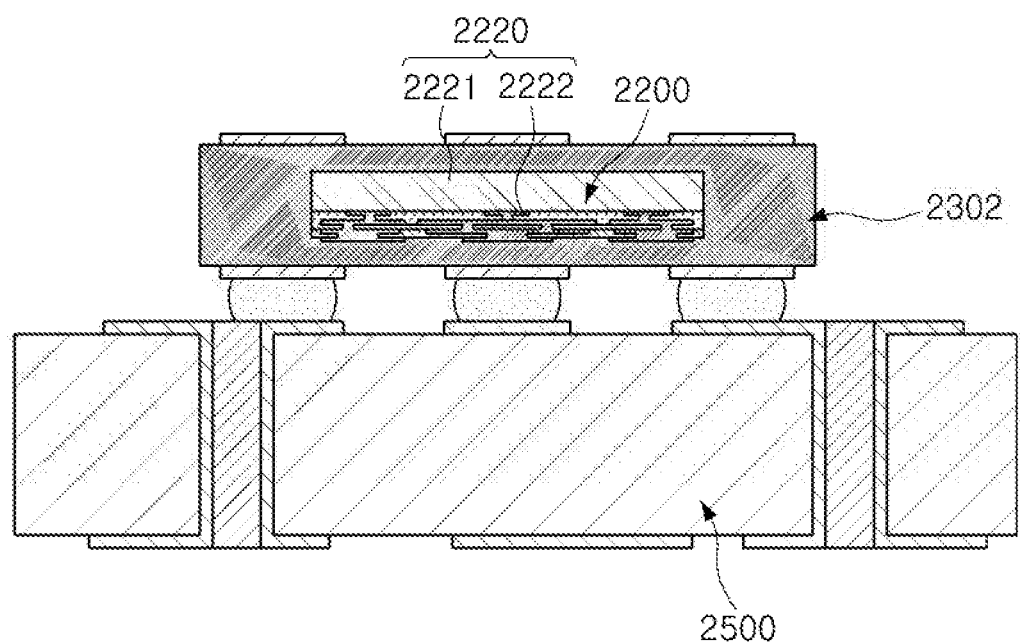
FIG. 20 is a schematic cross-sectional view illustrating a case in which a fan-in semiconductor package is embedded in an interposer substrate and is finally mounted on a mother board of an electronic device.

FIG. 20 is a cross-sectional view schematically illustrating a case where a fan-in semiconductor package is embedded in an interposer substrate and ultimately mounted on a mother board of an electronic device.

Referring to FIGS. 19 and 20, the connection pads 2222, that is, the I/O terminals, of the semiconductor chip 2220 of the fan-in semiconductor package 2200 are re-wired again through an interposer substrate 2301 and the fan-in semiconductor package 2200 mounted on the interposer substrate 2301 may ultimately be mounted on a mother board 2500 of an electronic device. Here, the electrical connection structure 2270, and the like, may be fixed by an underfill resin 2280, and the like, and the outer side may be covered with a molding material 2290, or the like. Alternatively, the fan-in semiconductor package 2200 may be embedded in a separate interposer substrate 2302, the connection pads 2222, i.e., the I/O terminals, of the semiconductor chip 2220 may be re-wired again by the interposer substrate 2302 in the embedded state, and the fan-in semiconductor package 2200 may ultimately be mounted on the mother board 2500 of the electronic device.

In this manner, since the fan-in semiconductor package is difficult to be directly mounted on the mother board of the electronic device, the fan-in semiconductor package may be mounted on the separate interposer substrate and then mounted on the mother board of the electronic device through a packaging process again or may be embedded in the interposer substrate and mounted on the mother board of the electronic device.

Figure 21:
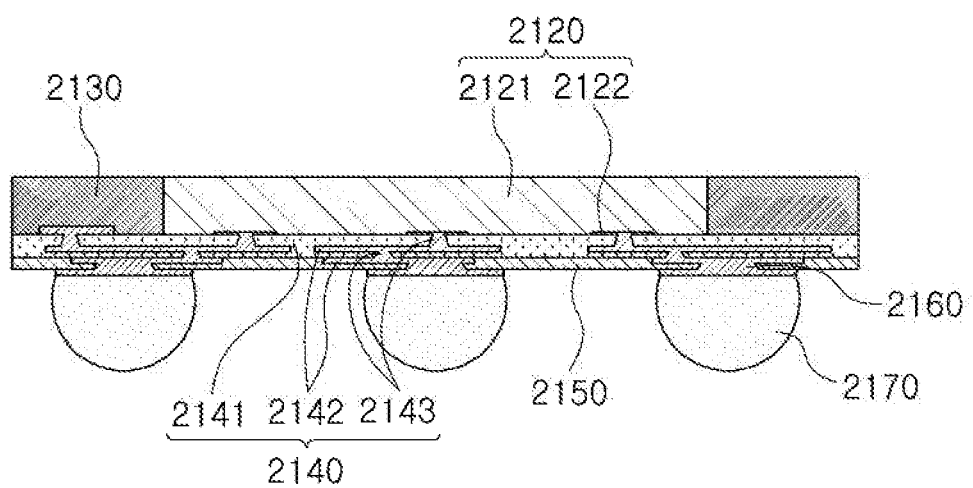
FIG. 21 is a schematic cross-sectional view illustrating a fan-out semiconductor package.

FIG. 21 is a cross-sectional view illustrating a schematic view of a fan-out semiconductor package.

Referring to FIG. 21, in the fan-out semiconductor package 2100, for example, the outer side of a semiconductor chip 2120 is protected by an encapsulant 2130, and the connection pads 2122 of the semiconductor chip 2120 are re-wired to the outer side of the semiconductor chip 2120 by the connection member 2140. Here, a passivation layer 2150 may further be formed on the connection member 2140, and an underbump metallization layer 2160 may further be formed in an opening of the passivation layer 2150. An electrical connection structure 2107 may further be formed on an underbump metallization layer 2160. The semiconductor chip 2120 may be an IC including a body 2121, a connection pad 2122, a passivation film (not shown), and the like. The connection member 2140 may include an insulating layer 2141, a re-wiring layer 2142 formed on the insulating layer 2241, and a via 2143 electrically connecting the connection pad 2122 and the re-wiring layer 2142.

As described above, the fan-out semiconductor package is in a form that the I/O terminals are re-wired and disposed even on the outer side of the semiconductor chip through the connection member formed on the semiconductor chip. As described above, in the fan-in semiconductor package, all the I/O terminals of the semiconductor chip must be disposed inside the semiconductor chip, and thus, if a device size is reduced, a ball size and pitch must be reduced, and as a result, a standardized ball layout may not be used. In contrast, in the fan-out semiconductor package, since the I/O terminals are re-wired and disposed even on the outer side of the semiconductor chip through the connection member formed on the semiconductor chip, although the size of the semiconductor chip is reduced, the standardized ball layout may be used as is. Therefore, the fan-out semiconductor package may be mounted on a mother board of an electronic device even without a separate interposer substrate as described hereinafter.

Figure 22:
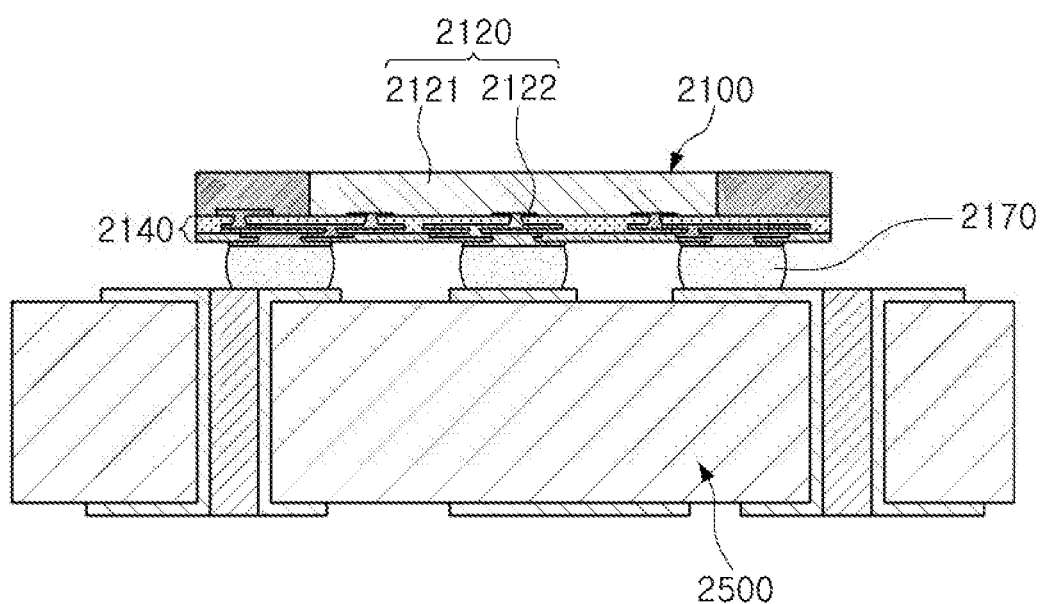
FIG. 22 is a schematic cross-sectional view illustrating a case in which a fan-out semiconductor package is mounted on a mother board of an electronic device.

FIG. 22 is a cross-sectional view schematically illustrating a case where a fan-out semiconductor package is mounted on a mother board of an electronic device.

Referring to FIG. 22, the fan-out semiconductor package 2100 may be mounted on the mother board 2500 of the electronic device through the electrical connection structure 2170, and the like. That is, as described above, the fan-out semiconductor package 2100 may include the connection member 2140 which may re-wire the connection pad 2122 to a fan-out area beyond the size of the semiconductor chip 2120, on the semiconductor chip 2120, the standardized ball layout may be used as is, and as a result, the fan-out semiconductor package 2100 may be mounted on the mother board 2500 of the electronic device even without a separate interposer substrate, or the like.

In this manner, since the fan-out semiconductor package may be mounted on the mother board of the electronic device even without a separate interposer substrate, a thickness of the fan-out semiconductor package may be smaller than that of the fan-in semiconductor package using an interposer substrate, achieving a small size and a small thickness. In addition, since the fan-out semiconductor package has excellent thermal properties and electrical properties, it is particularly suitable for mobile products. In addition, the fan-out semiconductor package may be realized to be more compact than a general package-on-package (POP) type using a PCB and solve a problem caused due to a bowing phenomenon.

Meanwhile, the fan-out semiconductor package refers to a package technology for mounting a semiconductor chip on a mother board of an electronic device and for protecting the semiconductor chip from an external impact and has a concept different from a PCB such as an interposer substrate which are different in scale, purpose, and the like, and having a fan-in semiconductor package embedded therein.

As set forth above, according to an exemplary embodiment in the present disclosure, an antenna module according to an exemplary embodiment in the present disclosure may have a structure which is easily miniaturized while having a high level of antenna performance by having a structure in which an antenna, an IC, and a second connection member are efficiently integrated with one another.

Since the antenna module according to an exemplary embodiment in the present disclosure may easily increase the number of wiring layers, the antenna module may provide aground pattern or an additional electrical path to an IC without separately sacrificing antenna performance or wiring efficiency.

Since the antenna module according to an exemplary embodiment in the present disclosure may easily increase the number of wiring layers without separately increasing a size according to an addition of a second connection member, the antenna module may have a structure that is easy to miniaturize while having a high level of antenna performance.

Since the antenna module according to an exemplary embodiment in the present disclosure may couple the connection member and the second connection member to each other without using a separate electrical connection structure such as a solder ball, the antenna module may have a structure that is easy to miniaturize.

The antenna module according to an exemplary embodiment in the present disclosure may secure structural stability while increasing the number of wiring layers.

While exemplary embodiments have been shown and described above, it will be apparent to those skilled in the art that modifications and variations could be made without departing from the scope of the present invention as defined by the appended claims.

What is claimed is:

1. An antenna module comprising:
a first connection member including a first wiring layer and a first insulating layer;
an antenna package disposed on a first surface of the first connection member, and including a plurality of antenna members configured to transmit and/or receive a signal and a plurality of feed vias, each having a first end electrically connected to a corresponding one of the plurality of antenna members and a second end electrically connected to a corresponding wire of the first wiring layer;
an integrated circuit (IC) disposed on a second surface of the first connection member and electrically connected to the corresponding wire of the first wiring layer; and
a second connection member including a second wiring layer electrically connected to the IC and a second insulating layer and disposed between the first connection member and the IC;
a first support member disposed on the second surface of the first connection member and surrounding side surfaces of the second connection member, and electrically connected to the corresponding wire of the first wiring layer so that an intermediate frequency (IF) signal or a base band signal passes therethrough,
wherein the second connection member has a third surface facing the first connection member and having an area smaller than that of the second surface, and a fourth surface facing the IC.

2. The antenna module of claim 1, further comprising a second support member disposed on the fourth surface of the second connection member and disposed to surround the IC.

3. The antenna module of claim 1, further comprising:
an encapsulant disposed to form a cell together with the second connection member and the IC and encapsulating at least a portion of the IC; and
a cell shielding member surrounding at least a portion of the cell.

4. The antenna module of claim 3, wherein the cell shielding member surrounds sides of the second connection member, sides of the IC and a bottom of the IC.

5. The antenna module of claim 1, wherein the first support member further includes a passive component disposed on the second surface of the first connection member and electrically connected to the corresponding wire of the first wiring layer,
the first support member includes a core via electrically connected to the corresponding wire of the first wiring layer, a core insulating layer surrounding a side surface of the core via, and a core wiring layer disposed on a first surface or a second surface of the core insulating layer and electrically connected to the core via, and
the first support member has an accommodating space surrounding the passive component.

6. The antenna module of claim 1, wherein the antenna package includes:
a dielectric layer disposed to surround each of the plurality of feed vias and having a thickness greater than that of the first insulating layer; and
a plating member disposed to surround each of the plurality of feed vias.

7. An antenna module comprising:
a first connection member including a first wiring layer and a first insulating layer;
an antenna package disposed on a first surface of the first connection member, and including a plurality of antenna members configured to transmit and/or receive a signal and a plurality of feed vias, each having a first end electrically connected to a corresponding one of the plurality of antenna members and a second end electrically connected to a corresponding wire of the first wiring layer;
a first support member disposed on a second surface of the first connection member and electrically connected to the corresponding wire of the first wiring layer so that an intermediate frequency (IF) signal or a base band signal passes therethrough;
an integrated circuit (IC) disposed on the second surface of the first connection member and electrically connected to the corresponding wire of the first wiring layer to transmit the IF signal or the base band signal by receiving a radio frequency (RF) signal or to transmit the RF signal by receiving the IF signal or the base band signal; and
a second connection member including a second wiring layer electrically connected to the IC and a second insulating layer, disposed between the first connection member and the IC, and surrounded by the support member.

8. The antenna module of claim 7, further comprising a second support member surrounding at least a portion of side surfaces of the IC, wherein the second support member is surrounded by the first support member.

9. The antenna module of claim 7, further comprising: an encapsulant disposed to form a cell together with the second connection member and the IC and encapsulating at least a portion of the IC; and
a cell shielding member disposed to surround sides of the second connection member and sides of the IC.

10. A antenna module comprising:
an antenna package comprising at least one antenna member configured to transmit and/or receive an electromagnetic signal, the at least one antenna member being electrically connected to a corresponding feed via at a first end;
a first connection member including a first wiring layer and a first insulating layer, and disposed on the antenna package such that a wire of the first wiring layer being electrically connected to a second end of the corresponding feed via;
an integrated circuit (IC) disposed on a surface of the first connection member opposite to the antenna package and electrically connected to the first wiring layer; and
a second connection member including a second wiring layer electrically connected to the IC and a second insulating layer and disposed between the first connection member and the IC; and
a support member disposed on the surface of the first connection member and surrounding side surfaces of the second connection member, and electrically connected to a corresponding wire of the first wiring layer so that an intermediate frequency (IF) signal or a base band signal passes therethrough, the support member comprising:
a core insulating layer having core vias electrically connected to respective wires of the first wiring layer and a core wiring layer disposed on a first or a second surface of the core insulating layer and electrically connected to the core vias, and
a first cavity for accommodating a cell comprising the IC having the second connection member disposed thereon such that the second connection member is electrically connected to the first connection member.

11. The antenna module of claim 10, wherein the support member further comprises a second cavity for accommodating a passive component, wherein the passive component is disposed in the second cavity and on the first connection member such that the passive component is electrically connected to the first wiring layer.

12. The antenna module of claim 10, wherein the first connection member is disposed between the antenna package and the support member.

13. The antenna module of claim 10, wherein the antenna package further comprises an antenna cavity including at least one director member, the at least one antenna member, plating members or shielding vias surrounding the at least one antenna member, and an electrical connection structure electrically connected to the first wiring layer.

* * * * *